US012563707B2

(12) United States Patent
Malouin et al.

(10) Patent No.: US 12,563,707 B2
(45) Date of Patent: Feb. 24, 2026

(54) COOLING MODULE WITH INTEGRATED PUMP FOR IMMERSION COOLING IN ELECTRONICS

(71) Applicant: JetCool Technologies Inc., Littleton, MA (US)

(72) Inventors: Bernard Malouin, Westford, MA (US); Ludwig C. Haber, Littleton, MA (US); Daniel Sweeney, Littleton, MA (US)

(73) Assignee: JetCool Technologies Inc., Littleton, MA (US)

( * ) Notice: Subject to any disclaimer, the term of this patent is extended or adjusted under 35 U.S.C. 154(b) by 311 days.

(21) Appl. No.: 18/383,157

(22) Filed: Oct. 24, 2023

(65) Prior Publication Data

US 2024/0138128 A1     Apr. 25, 2024
US 2024/0237307 A9     Jul. 11, 2024

Related U.S. Application Data

(60) Provisional application No. 63/418,829, filed on Oct. 24, 2022.

(51) Int. Cl.
*H05K 7/20*     (2006.01)
*H05K 1/02*     (2006.01)

(52) U.S. Cl.
CPC ....... *H05K 7/20836* (2013.01); *H05K 1/0203* (2013.01)

(58) Field of Classification Search
CPC . H01L 23/4735; H01L 23/473; H01L 23/367; H05K 7/20272; H05K 1/0203;
(Continued)

(56) References Cited

U.S. PATENT DOCUMENTS 236,519 A      1/1881    Walsh
3,765,728 A   10/1973    Peruglia
(Continued)

FOREIGN PATENT DOCUMENTS

CN     102414813 B    4/2014
CN     107567247 A    1/2018
(Continued)

OTHER PUBLICATIONS

Celli, "Compressible fluids," retrieved from the Internet: http://galileo.phys.virginia.edu/classes/311/notes/compflu2/node1.html, 1997.

*Primary Examiner* — Mandeep S Buttar
(74) *Attorney, Agent, or Firm* — Grady L. White; Brian J. Hairston; Potomac Law Group, PLLC

(57)     ABSTRACT

Embodiments of the present invention provide a cooling module for cooling heat-generating electronic devices in an immersion cooling system. The cooling module includes an integrated pump, which draws immersion fluid from the surrounding dielectric bath and drives it into a pressurized plenum to pressurize the coolant fluid and drive the pressurized coolant fluid through a nozzle plate containing a microconvective nozzle array. The array accelerates the fluid to produce a multiplicity of microjets that impinge on a surface of the heat-generating electronic device to be cooled. The effluent from the cooling module may be directed to flow into and wash over nearby heat-generating devices to help cool the nearby heat-generating devices. The effluent may also be directed to the inlets of daughter cooling modules attached to other heat-generating electronic devices. In some embodiments, cooling modules of the present invention may include fluid collection and fluid discharge manifolds that may be configured and arranged to target specific regions of an immersion bath that might otherwise become relatively stagnant, thereby enhancing overall system circulation and convective environment for
(Continued)

other nearby server components. In some embodiments, cooling modules of the present invention may include daughter cooling modules connected to the pressurized inlet plenum of the parent cooling module pressurized by its coolant pump. The addition of the cooling module to immersion bath cooling systems achieves much higher rates of cooling than can be achieved with immersion baths alone.

23 Claims, 13 Drawing Sheets

(58) Field of Classification Search
CPC ........... H05K 7/20236; H05K 7/20345; H05K 7/203; G06F 1/20; G06F 2200/201
USPC .......................................................... 361/689
See application file for complete search history.

(56) References Cited

U.S. PATENT DOCUMENTS

| | | | |
|---|---|---|---|
| 3,841,671 | A | 10/1974 | Walker |
| 3,980,112 | A | 9/1976 | Basham |
| 4,062,572 | A | 12/1977 | Davis |
| 4,090,539 | A | 5/1978 | Krupp |
| 4,696,496 | A | 9/1987 | Guelis et al. |
| 4,796,924 | A | 1/1989 | Kosugi et al. |
| 4,890,865 | A | 1/1990 | Hosono et al. |
| 4,922,971 | A | 5/1990 | Grantham |
| 5,021,924 | A | 6/1991 | Kieda et al. |
| 5,088,005 | A | 2/1992 | Ciaccio |
| 5,249,358 | A | 10/1993 | Tousignant et al. |
| 5,263,536 | A | 11/1993 | Hulburd et al. |
| 5,285,351 | A | 2/1994 | Ikeda |
| 5,309,319 | A | 5/1994 | Messina |
| 5,316,075 | A | 5/1994 | Quon et al. |
| 5,349,831 | A | 9/1994 | Daikoku et al. |
| 5,401,064 | A | 3/1995 | Guest |
| 5,491,363 | A | 2/1996 | Yoshikawa |
| 5,547,231 | A | 8/1996 | Sharp |
| 5,611,373 | A | 3/1997 | Ashcraft |
| 5,687,993 | A | 11/1997 | Brim |
| 5,720,325 | A | 2/1998 | Grantham |
| 5,959,351 | A | 9/1999 | Sasaki et al. |
| 5,999,404 | A | 12/1999 | Hileman |
| 6,105,373 | A | 8/2000 | Watanabe et al. |
| 6,144,013 | A | 11/2000 | Chu et al. |
| 6,366,462 | B1 | 4/2002 | Chu et al. |
| 6,528,878 | B1 | 3/2003 | Daikoku et al. |
| 6,546,951 | B1 | 4/2003 | Armenia et al. |
| 6,550,263 | B2 | 4/2003 | Patel et al. |
| 6,550,815 | B2 | 4/2003 | Zitkowic, Jr. et al. |
| 6,729,383 | B1 | 5/2004 | Cannell et al. |
| 6,952,346 | B2 | 10/2005 | Tilton et al. |
| 6,973,801 | B1 | 12/2005 | Campbell et al. |
| 7,007,506 | B2 | 3/2006 | Kubo et al. |
| 7,104,312 | B2 | 9/2006 | Goodson et al. |
| 7,149,087 | B2 | 12/2006 | Wilson et al. |
| 7,223,494 | B2 | 5/2007 | Takeshita et al. |
| 7,233,494 | B2 | 6/2007 | Campbell et al. |
| 7,241,423 | B2 | 7/2007 | Golbig et al. |
| 7,265,976 | B1 | 9/2007 | Knight |
| 7,277,283 | B2 | 10/2007 | Campbell et al. |
| 7,511,957 | B2 | 3/2009 | Campbell et al. |
| 7,787,248 | B2 | 8/2010 | Campbell et al. |
| 7,802,442 | B2 | 9/2010 | Bezama et al. |
| 7,866,173 | B2 | 1/2011 | Brunschwiler et al. |
| 7,916,483 | B2 | 3/2011 | Campbell et al. |
| 7,978,473 | B2 | 7/2011 | Campbell et al. |
| 7,992,627 | B2 | 8/2011 | Bezama et al. |
| 8,059,405 | B2 | 11/2011 | Campbell et al. |
| 8,266,802 | B2 | 9/2012 | Campbell et al. |
| 8,824,146 | B2 | 9/2014 | Brok et al. |
| 8,912,643 | B2 | 12/2014 | Bock et al. |
| 8,929,080 | B2 | 1/2015 | Campbell et al. |
| 8,944,151 | B2 | 2/2015 | Flotta et al. |
| 8,981,556 | B2 | 3/2015 | Joshi |
| 9,165,857 | B2 | 10/2015 | Song et al. |
| 9,247,672 | B2 | 1/2016 | Mehring |
| 9,252,069 | B2 | 2/2016 | Bhunia et al. |
| 9,445,529 | B2 | 9/2016 | Chainer et al. |
| 9,484,283 | B2 | 11/2016 | Joshi et al. |
| 9,521,787 | B2 | 12/2016 | Chainer et al. |
| 9,530,818 | B2 | 12/2016 | Stern et al. |
| 9,559,038 | B2 | 1/2017 | Schmit et al. |
| 9,560,790 | B2 | 1/2017 | Joshi et al. |
| 9,622,379 | B1 | 4/2017 | Campbell et al. |
| 9,638,477 | B1 | 5/2017 | Choi et al. |
| 9,653,378 | B2 | 5/2017 | Hou et al. |
| 9,750,159 | B2 | 8/2017 | Campbell et al. |
| 9,852,963 | B2 | 12/2017 | Shedd et al. |
| 9,901,008 | B2 | 2/2018 | Shedd et al. |
| 9,903,664 | B2 | 2/2018 | Joshi |
| 10,078,354 | B2 | 9/2018 | Eriksen et al. |
| 10,152,096 | B1 | 12/2018 | Chen et al. |
| 10,228,735 | B2 | 3/2019 | Kulkarni et al. |
| 10,270,220 | B1 | 4/2019 | Eppich et al. |
| 10,285,309 | B2 | 5/2019 | James et al. |
| 10,306,802 | B1 | 5/2019 | Ditri et al. |
| 10,426,062 | B1 | 9/2019 | Saunders |
| 10,473,252 | B2 | 11/2019 | Oberdorfer et al. |
| 10,512,152 | B2 | 12/2019 | Smith et al. |
| 10,561,040 | B1 | 2/2020 | Lunsman et al. |
| 10,651,112 | B2 | 5/2020 | Malouin, Jr. et al. |
| 10,665,529 | B2 | 5/2020 | Smith et al. |
| 10,903,141 | B2 | 1/2021 | Malouin, Jr. et al. |
| 10,985,089 | B2 | 4/2021 | Hart et al. |
| 11,018,077 | B2 | 5/2021 | Smith et al. |
| 11,096,313 | B2 | 8/2021 | Amos et al. |
| 11,322,426 | B2 | 5/2022 | Malouin, Jr. et al. |
| 11,439,037 | B2 | 9/2022 | Subrahmanyam et al. |
| 11,594,470 | B2 | 2/2023 | Smith et al. |
| 11,710,678 | B2 | 7/2023 | Ganti et al. |
| 2002/0075651 | A1 | 6/2002 | Newton et al. |
| 2002/0113142 | A1 | 8/2002 | Patel et al. |
| 2004/0051308 | A1 | 3/2004 | Coates |
| 2004/0194492 | A1 | 10/2004 | Tilton et al. |
| 2005/0143000 | A1 | 6/2005 | Eisele et al. |
| 2005/0210906 | A1 | 9/2005 | Laufer et al. |
| 2005/0280994 | A1 | 12/2005 | Yazawa |
| 2006/0042825 | A1 | 3/2006 | Lu et al. |
| 2006/0250773 | A1 | 11/2006 | Campbell et al. |
| 2006/0250774 | A1 | 11/2006 | Campbell et al. |
| 2007/0017659 | A1 | 1/2007 | Brunschwiler et al. |
| 2007/0091569 | A1 | 4/2007 | Campbell et al. |
| 2007/0121294 | A1 | 5/2007 | Campbell et al. |
| 2007/0121299 | A1 | 5/2007 | Campbell et al. |
| 2007/0221364 | A1 | 9/2007 | Lai et al. |
| 2007/0272392 | A1 | 11/2007 | Ghosh et al. |
| 2007/0274045 | A1 | 11/2007 | Campbell et al. |
| 2007/0295480 | A1 | 12/2007 | Campbell et al. |
| 2008/0037221 | A1 | 2/2008 | Campbell et al. |
| 2008/0278913 | A1 | 11/2008 | Campbell et al. |
| 2009/0013258 | A1 | 1/2009 | Hintermeister et al. |
| 2009/0032937 | A1 | 2/2009 | Mann et al. |
| 2009/0284821 | A1 | 11/2009 | Valentin et al. |
| 2009/0294105 | A1 | 12/2009 | Sundararajan et al. |
| 2009/0294106 | A1 | 12/2009 | Flotta et al. |
| 2009/0314467 | A1 | 12/2009 | Campbell et al. |
| 2009/0316360 | A1 | 12/2009 | Campbell et al. |
| 2010/0052714 | A1 | 3/2010 | Miller |
| 2010/0276026 | A1 | 11/2010 | Powell et al. |
| 2010/0290190 | A1 | 11/2010 | Chester et al. |
| 2010/0328882 | A1 | 12/2010 | Campbell et al. |
| 2010/0328888 | A1 | 12/2010 | Campbell et al. |
| 2010/0328889 | A1 | 12/2010 | Campbell et al. |
| 2011/0277491 | A1 | 11/2011 | Wu et al. |
| 2012/0048515 | A1 | 3/2012 | Bhunia et al. |
| 2012/0063091 | A1 | 3/2012 | Dede et al. |
| 2012/0160459 | A1 | 6/2012 | Flotta et al. |
| 2012/0212907 | A1 | 8/2012 | Dede |
| 2014/0085823 | A1 | 3/2014 | Campbell et al. |
| 2014/0124167 | A1 | 5/2014 | Campbell et al. |
| 2014/0126150 | A1 | 5/2014 | Song et al. |

US 12,563,707 B2

Page 3

(56) References Cited

U.S. PATENT DOCUMENTS

| | | |
|---|---|---|
| 2014/0158326 A1 | 6/2014 | Lyon |
| 2014/0190668 A1 | 7/2014 | Joshi et al. |
| 2014/0204532 A1 | 7/2014 | Mehring |
| 2014/0205632 A1 | 7/2014 | Gruber et al. |
| 2014/0264759 A1 | 9/2014 | Koontz et al. |
| 2014/0284787 A1 | 9/2014 | Joshi |
| 2014/0293542 A1 | 10/2014 | Vetrovec |
| 2014/0352937 A1 | 12/2014 | Draht |
| 2015/0043164 A1 | 2/2015 | Joshi |
| 2015/0096722 A1 | 4/2015 | Zweiback et al. |
| 2015/0131224 A1 | 5/2015 | Barina et al. |
| 2015/0208549 A1 | 7/2015 | Shedd et al. |
| 2016/0013115 A1 | 1/2016 | Vadhavkar et al. |
| 2016/0014932 A1 | 1/2016 | Best et al. |
| 2016/0020160 A1 | 1/2016 | Buvid et al. |
| 2016/0120058 A1 | 4/2016 | Shedd et al. |
| 2016/0143184 A1 | 5/2016 | Campbell et al. |
| 2016/0278239 A1 | 9/2016 | Chainer et al. |
| 2017/0092565 A1 | 3/2017 | Chen et al. |
| 2017/0150649 A1 | 5/2017 | Chester et al. |
| 2017/0179001 A1 | 6/2017 | Brunschwiler et al. |
| 2017/0347487 A1 | 11/2017 | Rudnicki et al. |
| 2018/0027695 A1 | 1/2018 | Wakino et al. |
| 2018/0040538 A1 | 2/2018 | Schuderer et al. |
| 2018/0090417 A1 | 3/2018 | Gutala et al. |
| 2018/0124949 A1 | 5/2018 | Marroquin et al. |
| 2019/0013258 A1 | 1/2019 | Malouin, Jr. et al. |
| 2019/0029105 A1 | 1/2019 | Smith et al. |
| 2019/0195399 A1 | 6/2019 | Nguyen et al. |
| 2019/0235449 A1 | 8/2019 | Slessman et al. |
| 2019/0289749 A1 | 9/2019 | Dariavach et al. |
| 2019/0348345 A1 | 11/2019 | Parida et al. |
| 2020/0006197 A1 | 1/2020 | Hart et al. |
| 2020/0011620 A1 | 1/2020 | Sherrer et al. |
| 2020/0015383 A1 | 1/2020 | Gao |
| 2020/0027819 A1 | 1/2020 | Smith et al. |
| 2020/0033075 A1 | 1/2020 | Veto et al. |
| 2020/0100396 A1 | 3/2020 | Iyengar et al. |
| 2020/0168526 A1 | 5/2020 | Malouin, Jr. et al. |
| 2020/0214126 A1 | 7/2020 | Nakashima et al. |
| 2020/0253092 A1 | 8/2020 | Chainer et al. |
| 2020/0296862 A1 | 9/2020 | Iyengar et al. |
| 2020/0312746 A1 | 10/2020 | Smith et al. |
| 2020/0328139 A1 | 10/2020 | Chiu et al. |
| 2020/0350231 A1 | 11/2020 | Shen et al. |
| 2021/0134703 A1 | 5/2021 | Malouin, Jr. et al. |
| 2021/0265240 A1 | 8/2021 | Smith et al. |
| 2021/0351108 A1* | 11/2021 | Diglio ............... H01L 23/427 |
| 2022/0151097 A1 | 5/2022 | McManis et al. |
| 2022/0230937 A1 | 7/2022 | Malouin et al. |
| 2022/0253112 A1 | 8/2022 | Hinton et al. |
| 2023/0301020 A1* | 9/2023 | Gao ............... H05K 7/20236 |

FOREIGN PATENT DOCUMENTS

| | | |
|---|---|---|
| CN | 105027021 B | 4/2019 |
| EP | 3188230 A1 | 7/2017 |
| KR | 20110028428 A | 3/2011 |
| KR | 20190077920 A | 7/2019 |
| WO | 2019018597 A1 | 1/2019 |

* cited by examiner

FIG. 3 - Exemplary Target System
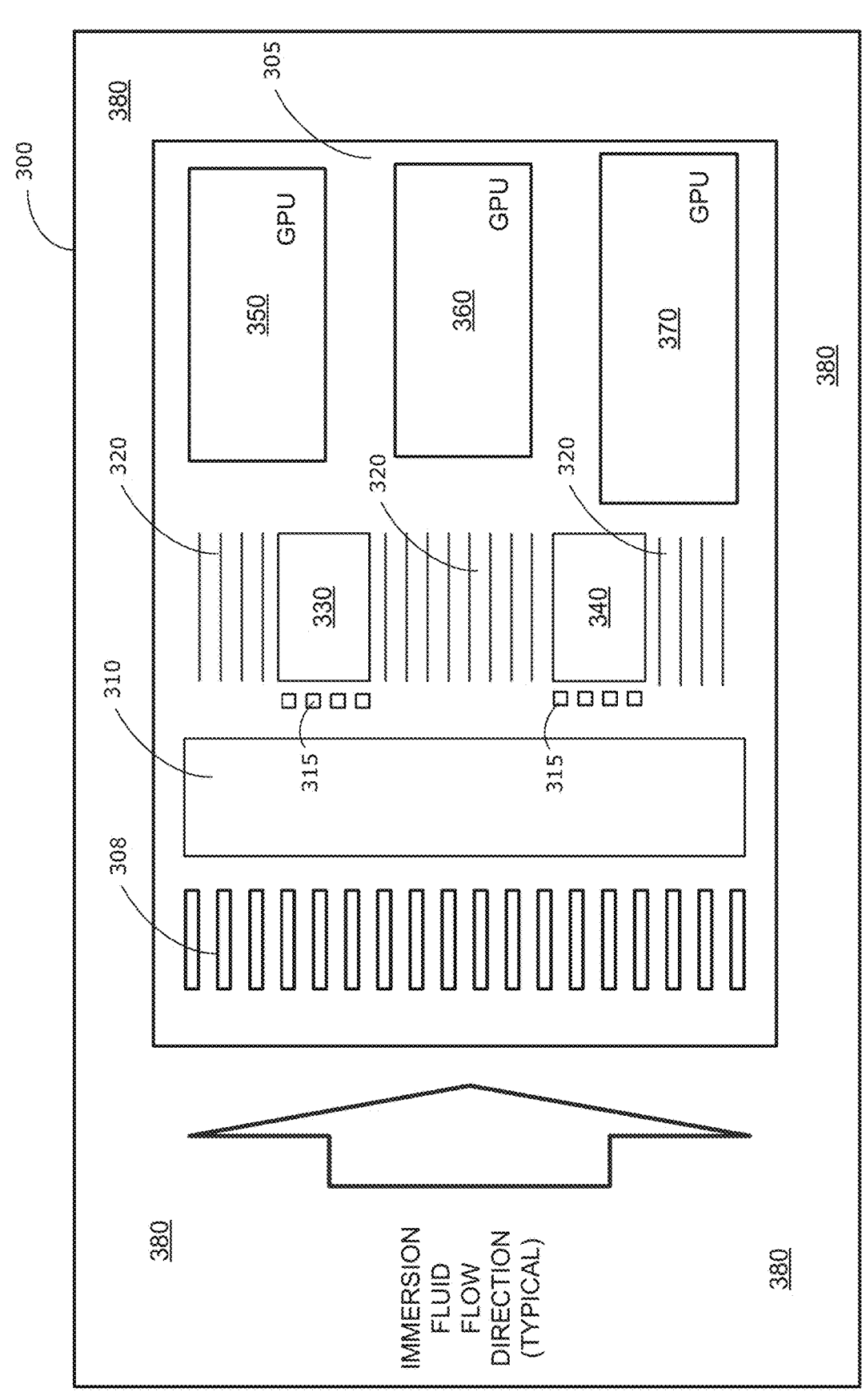

FIG. 4 - Cooling Assembly Comprising
Two Cooling Modules Mounted on Top of the Two CPUs FIG. 5 – Cooling Assembly Comprising a Single Cooling Module Mounted to a GPU and two Daughter Cooling Modules Mounted to Two CPUs FIG. 6 - Cooling Assembly Comprising Two Cooling Modules Mounted to a
GPU and a CPU, and two Daughter Cooling Module Mounted to One CPU Cooling Module with a Side-mounted
Tri-lobe styled positive displacement pump (Side Section – Cut at Pump Rotors)

(Front Section – Cut at Rotor Drive)

Cooling Module with a Top-mounted
Tri-lobe styled Positive Displacement Pump (Top Section – Cut at Pump Rotors)

(Front Section – Cut at Rotor Drive)

Cooling Module with a Side-mounted
Centrifugal Pump (Side Section — Cut at Pump Rotors)

(Front Section — Cut at Rotor Drive)

Cooling Module with a Top-mounted
Positive Centrifugal Pump (Top Section — Cut at Pump Rotors)

(Front Section — Cut at Rotor Drive)

Cooling Module with a Side-mounted Axial Pump (Side Section – Cut at Pump Rotors)

(Front Section – Cut at Rotor Drive)

COOLING MODULE WITH INTEGRATED PUMP FOR IMMERSION COOLING IN ELECTRONICS

FIELD OF THE INVENTION

The present invention relates generally to methods and devices for cooling high-powered heat-generating electronic devices, and more particularly to cooling modules and cooling assemblies for central processing units (CPUs), graphical processing units (GPUs), power converters and power inverters.

RELATED ART

Electronic devices, such as CPUs, GPUs, chip sets and power converters and power inverters produce considerable amounts of waste heat during operation. Because excessive waste heat and high temperatures inside and around such heat-generating devices tend to limit processing performance and reduce component lifespans, it is considered imperative to manage thermal loads of processors by removing and/or dissipating as much heat as possible as quickly as possible. A traditional method of moderating, removing and dissipating excess waste heat produced by heat-generating electronic devices involves using fan-cooled heat sinks to continuously force a coolant fluid, such as air, water or oil, to hit and pass over a surface of the heat-generating device. However, as heat-generating electronic components continue to get smaller (and more powerful), and printed circuit boards (PCBs) become more and more densely packed with heat-generating electronic components, the traditional techniques of forcing air and liquid to contact the surface of the heat-generating electronic components are becoming less and less effective at moderating, removing and/or dissipating a sufficient amount of excess heat.

In an attempt to address this problem, electrically non-conductive coolant fluids have been introduced that allow electronic assemblies and PCBs to be fully immersed in a bath of the non-conductive fluids during operation without damaging the assemblies, PCBs or the heat-generating electronics attached thereto. However, typical immersion coolants have a relatively low thermal conductivity, the result being that many modern high-powered CPUs and GPUs can still produce so much excess heat that even immersion cooling cannot reliably remove a sufficient amount of heat to preserve or improve the high-performance levels and longer lifespans required by modern computer and data processing applications. Furthermore, typical immersion cooling systems provide only very slow flow rates for the liquids flowing over and through the electronic assemblies and PCBs being cooled. Dead flow regions in the immersion baths can develop, which can lead to locally higher and possibly unacceptably hot temperatures (hot spots) of certain electronic components in an immersion bath containing many electric components. Therefore, it is sometimes very difficult or impossible to ensure even cooling for all the components in an immersion bath, an assembly or on a PCB.

In response to these problems, some in the industry have adopted the use of finned heat sinks, affixed to the top of the immersion-cooled CPUs and GPUs, which are configured help absorb some of the heat produced by the CPUs and GPUs. But a thermal interface material (TIM) must be used to attach the finned heat sinks to the CPUs and GPUs, and the TIM has to be compatible with the electronically non-conductive coolant used in the immersion bath. Consequently, systems and methods utilizing finned heat sinks in immersion baths typically require more expensive TIMs compared to TIMs used in traditional water or glycol based liquid cooling systems (non-immersion cooling systems). Even with very expensive TIMs, the ability of conventional immersion cooling baths used in conjunction with finned heat sinks to reliably remove enough heat to manage the heat loads associated with operating future processors is extremely questionable.

Accordingly, there is considerable need in the computer and data processing industries for less expensive and more effective immersion cooling systems for cooling high-powered and high heat-generating electronic components.

SUMMARY OF THE INVENTION

To address this need, and solve the above-described and other problems associated with conventional immersion bath cooling systems, embodiments of the present invention provide a cooling module with an integrated pump configured to pressurize the coolant fluid inside the cooling module and accelerate the fluid through microjet nozzles achieve much higher rates of cooling than immersion bath systems alone can achieve. The pump draws in immersion coolant from the surrounding dielectric bath fluid and drives it through microconvective nozzle arrays inside the cooling module to enhance cooling of the heat-generating device, thereby enhancing overall system circulation and convective environment for other nearby electronic components.

Notably, pump may be entirely incorporated into the cooling module, or otherwise permanently or removably affixed to one side or the top of the cooling module. In either case, the cooling module containing the integrated pump is attached to the electronic component to be cooled, such as a CPU, a GPU for a computer system or server, a power converter, a power inverter, or some other type of heat-generating electronic device. The heat-generating electronic processor or device is typically affixed to a printed circuit board (PCB), along with other electronic components. To help manage and/or remove the excess heat produced by the heat-generating electronic processor, the PCB containing the heat-generating components and the cooling module with the integrated pump are placed in an immersion cooling system. The liquids used in an immersion cooling system is usually a non- or low-conducting dielectric fluid, such as mineral oil or polyalphaolefin (PAO) oil. The fluid conducts heat away from the devices, and can be circulated through a heat exchanger to remove the heat generated by the devices. Typically, but not necessarily, the PCB containing the cooling module with integrated pump is placed in an immersion bath along with other PCBs containing additional electronic components. For purposes of the present invention, the immersion cooling system may comprise a single-phase immersion cooling system or a two-phase immersion cooling system. In a single-phase immersion cooling system, the coolant fluid remains in a liquid state and is circulated through a heat exchanger to remove the heat. In a two-phase immersion cooling system, a secondary cooling loop sits within the primary loop and contains a second fluid that changes phase due to heat absorption from heat generating devices and is recondensed by losing heat to the primary loop immersion coolant.

In general terms, physical embodiments of the present invention provide a cooling module for cooling a heat-generating electronic device attached to a printed circuit board immersed in a container or tank of immersion fluid. The cooling module comprises a housing, a nozzle plate, a fastener for attaching the cooling module to the heat-generating electronic device, a plenum, an inlet in the housing, an outlet and the integrated pump. The system may also include an electric motor for running the pump. The nozzle plate is fixedly attached to the housing, and comprises a fluid receiving side, a fluid ejection side, opposite the fluid receiving side, and a multiplicity of nozzles extending through the nozzle plate from the fluid receiving side to the fluid ejection side. Each nozzle in the nozzle plate is adapted to produce a microjet of immersion fluid as immersion fluid pressurized by the pump exits the fluid ejection side of the nozzle plate. The fastener is designed to attach the cooling module to the heat-generating electronic device, opposite the printed circuit board, so that the fluid ejection surface of the nozzle plate is oriented to face an impingement zone on the heat-generating electronic device. Once fastened to the heat-generating electronic device, the fluid ejection surface of the nozzle plate is spaced apart from the impingement zone so as to define an impingement channel and an outlet between the cooling module and the heat-generating electronic device.

The plenum is a chamber inside the housing defined by the inner walls of the housing and the nozzle plate. The inlet is formed in the housing and is configured for fluid communication with the plenum. Thus, the inlet permits immersion fluid in the container to be drawn into the housing. The pump has a motor that is mechanically connected to a set of rotors disposed inside the housing between the inlet and the plenum. These rotors are typically located near the inlet (or a channel connected to the inlet), so that when the rotors in the pump are rotated by the operation of the motor, the rotation draws immersion fluid from the container into the housing through the inlet and pushes the immersion fluid into the plenum, causing the plenum to fill and become pressurized. Pressurizing the plenum pushes immersion fluid in the plenum into the nozzles of the nozzle plate, which causes the nozzles to eject a multiplicity of microjets into the impingement channel between the nozzle plate and the heat-generating device. The multiplicity of microjets strike the impingement zone of the heat-generating electronic device at a high velocity before exiting the cooling module through the outlet, which removes heat from the heat-generating electronic device.

Implementations of the present invention may be beneficially utilized to enhance and improve the efficiency of immersion cooling systems used in a variety of different applications, including without limitation, data centers, high-performance computing, cryptocurrency mining and electric power inverters. In data center applications, immersion cooling is used to cool servers and other computing equipment. In high-performance computing applications, immersion cooling is used to cool advanced processors that have the ability to process extremely large amounts of data and/or perform very complex calculations at high speeds, and these advanced processors produce a large amount of waste heat that must be cooled in order to achieve the required performance. In cryptocurrency mining, immersion cooling systems are used to cool cryptocurrency mining rigs, which generate a considerable amount of heat. In electric power inverters, immersion cooling systems are used to cool electric drive components that convert the stored electrical energy (typically direct current (DC)) to the driving voltage for electric motors (typically alternating current (AC)), where the conversion process generates a significant amount of waste heat that can limit the power density of the component arrangement and the maximum throughput per component set.

Integrating the pump into the cooling module in an immersion system offers the advantage of being less dependent on the longevity or quality of the seals in the pump and reduces or eliminates the need for lubrication (to the extent that the pump mechanisms require it) because coolant fluid constantly flows into and all around the pump mechanisms, thereby providing lubrication. Because the cooling provided by the system is not based on solid contact heat spreading (e.g. finned heat sink), it is not required that any TIMs be disposed between the cooling module and the component to be cooled.

The chamber containing the rotors of the pump is equipped with an inlet that draws fluid in (inlet) and the cooling module impingement channel is equipped with an exit that collects fluid and expels it (outlet). The inlet and outlet (of which there could be several, even for one pump) is used to help optimize the uniformity of cooling within the electronics assembly where the immersion cooling is implemented. This can be done locally, near the cooling module but also potentially further away by either drawing in or expelling the fluid through one or more flow conduits. Furthermore, both the inlets and the outlets to the pump are designed to selectively enhance cooling of other components within the electronics assembly and avoid the creation of dead flow regions and the associated deviations in component temperatures.

The cooling module structure itself uses the pump to pressurize the inlet flow into a plenum that supplies immersion fluid to the micro-convective nozzle array. An outlet on the opposite side of the microconvective nozzle array(s) from the plenum then allows the immersion fluid to flow out of the cooling module to be dispersed in the immersion fluid of the immersion bath.

Several types of pumps can be used in implementations of the present invention, including without limitation, positive displacement pumps, centrifugal pumps and axial pumps. In each case, the seal and lubrication requirements for the integrated pump can be relaxed, taking advantage of the lubricating properties of the coolant and the fact that minor leakage is acceptable in an immersion environment, so long as the leakage is not so great as to undermine or prevent the pressurization of the immersion fluid inside the plenum or the acceleration and high-velocity impingement functions performed by the microconvective nozzle array in the nozzle plate.

To optimize thermal performance, the cooling module inlet may be directly connected to an external heat exchanger that provides immersion fluid at the desired inlet temperature to the inlet of the cooling module (rather than the immersion fluid temperature in the immediate vicinity of the device to be cooled). Similarly, the discharge of the cooling module, instead of being immediately discharged back into the immersion cooling bath may be directed first to an external heat exchanger whose performance may be optimized by collecting immersion fluid that has just increased in temperature after cooling a significant heat source within the electronic assembly. The discharge of the heat exchanger (being cooler than discharged from the cooling module) may then be directed at other heat loads within the immersion bath that require improved cooling but aren't of sufficiently high density to warrant their own cooling module.

BRIEF DESCRIPTION OF THE FIGURES

The accompanying drawings, which are incorporated in and constitute part of the specification, illustrate preferred embodiments of the invention, and, together with the description, serve to explain the principles of the present invention. In the drawings, like reference numbers indicate identical or functionally similar elements. Additionally, the left-most digit(s) of a reference number identifies the drawing in which the reference number first appears.

FIG. 3 shows a high-level schematic diagram illustrating by way of example a typical target system where using embodiments of the present invention provide enhanced cooling performance.

FIG. 4 shows a high-level schematic diagram illustrating by way of example an immersion cooling system comprising a cooling assembly of two cooling modules constructed in accordance with an embodiment of the present invention attached to the CPUs of the typical target system shown in FIG. 3.

FIG. 5 shows a high-level schematic diagram illustrating by way of example an immersion cooling system comprising a cooling assembly containing a single cooling module mounted on top of a GPU and two daughter cooling modules constructed in accordance with embodiments of the present invention mounted to the top of the two CPUs shown in FIG. 3.

FIG. 6 shows a high-level schematic diagram illustrating by way of example an immersion cooling system comprising a cooling assembly made of two independent cooling modules constructed in accordance with an embodiment of the present invention mounted on top of a GPU and CPU, respectively, and one daughter cooling module constructed in accordance with embodiments of the present invention mounted to the top of one CPU shown in the target system depicted in FIG. 3.

FIG. 7B is a cross-sectional view of the nozzle plate shown in FIG. 7A when it is sectioned along line 7B-7B of FIG. 7A.

FIG. 9A shows a front sectional view of the cooling module, sectioned along the line SV-SV of FIG. 8A. FIG. 9B shows a side sectional view of the cooling module, sectioned along the line 9B-9B of FIG. 9A.

FIG. 10A shows a front sectional view of the cooling module, sectioned along the center of the rotor drive, and FIG. 10B shows a top sectional view of the cooling module, sectioned along the line 10B-10B of FIG. 10A.

FIG. 11A shows a front sectional view of the cooling module, sectioned along the line SV-SV of FIG. 8A, and FIG. 11B shows a side sectional view of the cooling module, sectioned along the line 11B-11B of FIG. 11A.

FIG. 12A shows a front sectional view of the cooling module, sectioned along the line SV-SV of FIG. 8A. FIG. 12B shows a top sectional view of the cooling module, sectioned along the line 12B-12B of FIG. 12A.

FIG. 13A shows a front sectional view of the cooling module, sectioned along the line SV-SV of FIG. 8A. FIG. 13B shows a side sectional view of the cooling module, sectioned along the line 13B-13B of FIG. 13A.

DETAILED DESCRIPTION OF THE PREFERRED EMBODIMENTS

Reference will now be made in detail to the preferred embodiments of the invention, examples of which are illustrated in the accompanying drawings. Notably, the present invention may be implemented using a variety of different configurations, as would be apparent to those of skill in the art, and the figures and examples below are not meant to limit the scope of the present invention or its embodiments or equivalents.

Figure 1:
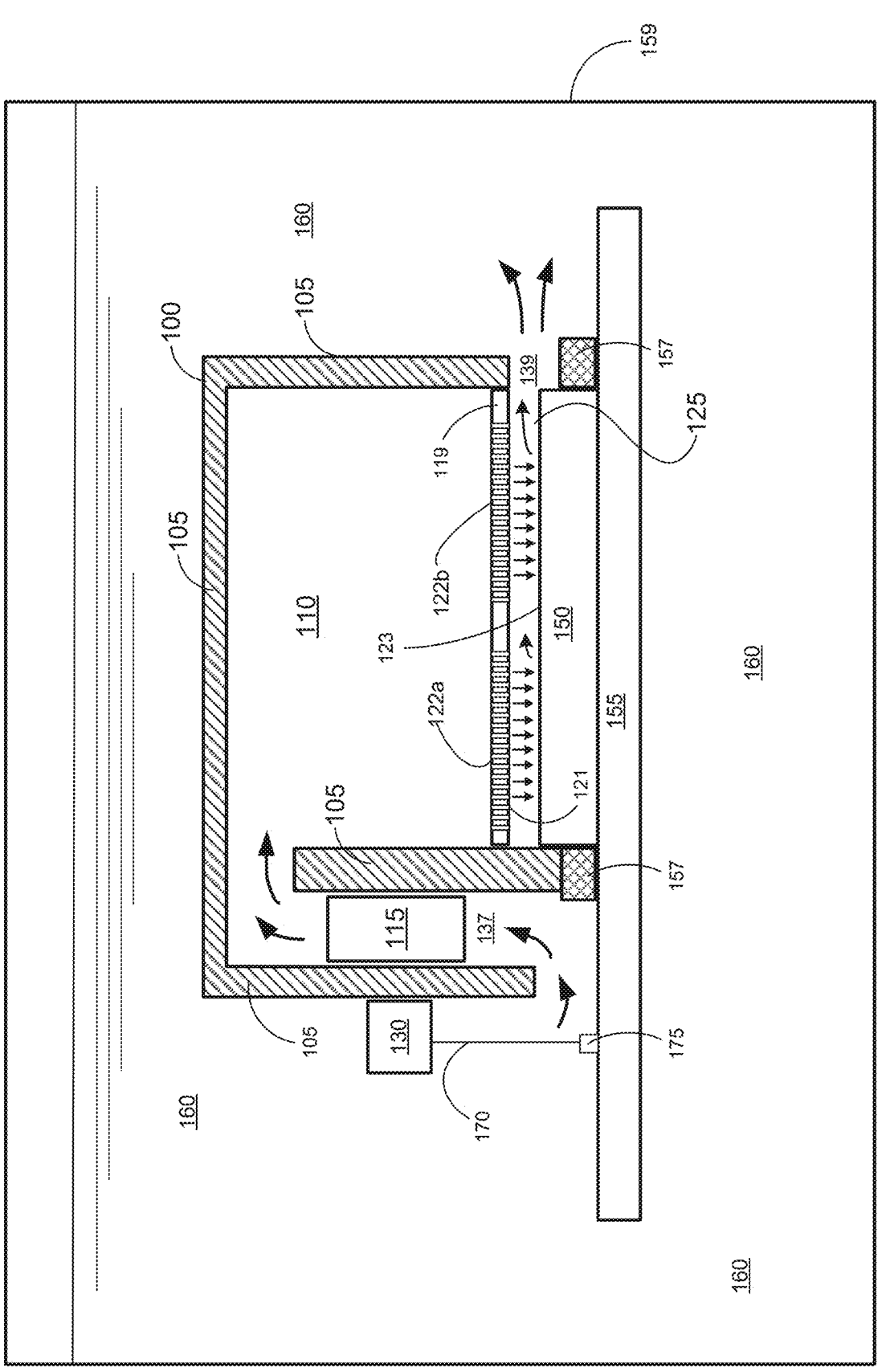
FIG. 1 shows a high-level schematic diagram illustrating by way of example a cooling module with integrated pump constructed in accordance with an embodiment of the invention.

FIG. 1 shows a high-level schematic diagram of a cooling module 100 constructed and arranged in accordance with one embodiment of the present invention. As shown in FIG. 1, the cooling module 100 is submerged in a tank 159 of non-conductive immersion fluid 160, such as mineral oil. The cooling module 100 comprises a housing 105, a plenum 110 defined by the inner walls of the housing 105, a pump 115, an electric motor 130 operable to drive the rotors of the pump 115, and a nozzle plate 119 comprising two microconvective nozzle arrays 122a and 122b. The walls of the housing 105 are constructed and arranged to provide an inlet 137 to let immersion fluid 160 inside the tank 159 to flow (or be drawn) into the interior of the housing 105. The walls of the housing 105 are further arranged so that the pump 115 is interposed between the inlet 137 and the plenum 110, the result being that any immersion fluid 160 passing from the inlet 137 into the plenum 110 first must pass through the pump 115. See FIG. 1. Each one of the two microconvective nozzle arrays 122a and 122b in the nozzle plate 119 comprises a multiplicity of nozzles (shown best in FIGS. 7A and 7B). Each nozzle is configured so that at least some of the immersion fluid 160 that is located inside the plenum 110 will be forced to pass into and through the nozzles when the immersion fluid 160 inside the plenum is pressurized by operation of the pump 115. Although FIG. 1 shows two microconvective nozzle arrays 122*a* and 122*b* in the nozzle plate 119, it should be understood that the nozzle plate may have any number of microconvective nozzle arrays, or any number of nozzles without those nozzles being organized into individual arrays. For example, the nozzles may be randomly located about the nozzle plate, so long as they are capable of generating microjets from immersion fluid put under pressure by the pump. It should also be understood that the nozzle plate may contain a variety of different nozzle sizes, different shapes and different outflow directions within a given group or randomly arranged nozzles within the nozzle plate(s) 119.

The cooling module 100 in FIG. 1 may be fastened to the heat-generating device, such as a CPU or GPU, fastened to a printed circuit board (PCB) 155, or both, by means of a fastening base 157 (such as bolster plate or CPU mounting frame). The heat-generating electronic device 150 is mounted to the top surface of the PCB 155 so that, after the cooling module 100 is attached to the PCB 155, the heat-generating electronic device 150 will lie between the nozzle plate 119 and the PCB 155, and the bottom surface 121 of the nozzle plate 119 and the top surface 123 of the heat-generating electronic device 150 are fixed in a spaced-apart relationship, with the fluid ejection side of the nozzle plate oriented to face a surface of the heat-generating electronic device. Owing to this spaced-apart orientation, the bottom surface 121 of the nozzle plate 119 (referred to as the fluid ejection side of the nozzle plate) and the top surface 123 of the heat-generating electronic device 150 (hereinafter referred to as the impingement zone of the heat-generating electronic device) define an impingement channel 125 and an outlet 139 that allows the microjets of immersion fluid 160 ejected from the fluid ejection side of the nozzles in the two microconvective nozzle arrays 122*a* and 122*b* of the nozzle plate 119 to strike the top surface (impingement zone) 123 of the heat-generating device 150 before being discharged by the outlet 139 back into the tank 159 to mix with the rest of the immersion fluid 160 in the tank 159. Typically, the PCB 155 will have a multiplicity of other surface-mounted electronic components attached to it, including for example, relays, power supplies, resistors, memory modules (e.g., RAM), expansion card connectors and voltage regulating modules. The effluent from the outlet 139 may be beneficially guided to flow into or wash over these other devices to improve the cooling of these other devices. For simplicity in the illustration, however, these other devices are not shown in FIG. 1.

The motor 130 connected to the pump 115 may be powered, for example, by an electrical power cable 170 connected to a power supply connector 175 on board the PCB 155. The cooling module 100, motor 130, power line 170, heat-generating electronic component 150 and PCB 155 are all immersed in the immersion bath tank 159 filled with an immersion fluid 160. When power is supplied to the motor 130 via the power supply port 175 and power cable 170, the motor 130 turns the set of rotors on the pump 115 so that the set of rotors on the pump 115 draws immersion fluid 160 out of the tank 159 and into the housing 105 through the one or more inlets 137 of the housing 105. The rotors also force that immersion fluid 160 drawn into the housing 105 to flow into the plenum 110, which pressurizes the immersion fluid 160 inside the plenum 110. The increased pressure inside the plenum 110 drives immersion fluid 160 located in the plenum 110 into and through nozzles in the microconvective nozzle arrays 122*a* and 122*b* of the nozzle plate 119.

The pressure provided by the rotating rotors in the pump 115 and the geometry of the nozzles in the microconvective nozzle arrays 122*a* and 122*b* of the nozzle plate 119 greatly accelerates the flow of immersion fluid 160 as it passes through the nozzles, out of the fluid ejection side of the nozzle plate, and into the impingement channel 125 as microjets of fluid. The nozzles in the microconvective nozzle array 122*a* and 122*b* are configured to direct the microjets of immersion fluid 160 to traverse the impingement channel 125 to strike the top surface (impingement zone) 123 of the heat-generating electronic device 150 at a high velocity before passing out of the outlet 139 of the cooling module 100. As the microjets of immersion fluid 160 flow over the impingement zone 123 of the heat-generating electronic device 150, the immersion fluid 160 absorbs heat from the impingement zone 123 of the heat-generating electronic device 150 and carries (or pushes) that heat through the outlet 139 and out into the tank 159 to the mix with the rest of the immersion fluid 160 in the tank 159.

A variety of different types of pumps and pump designs may be used to carry out the functions of the pump 115 in embodiments of the present invention, including without limitation, positive displacement pumps, centrifugal pumps and axial pumps. Other types of pumps, may be suitably adapted to use in implementations of the present invention, depending on the specific requirements and objectives of the immersion cooling system.

Figure 2:
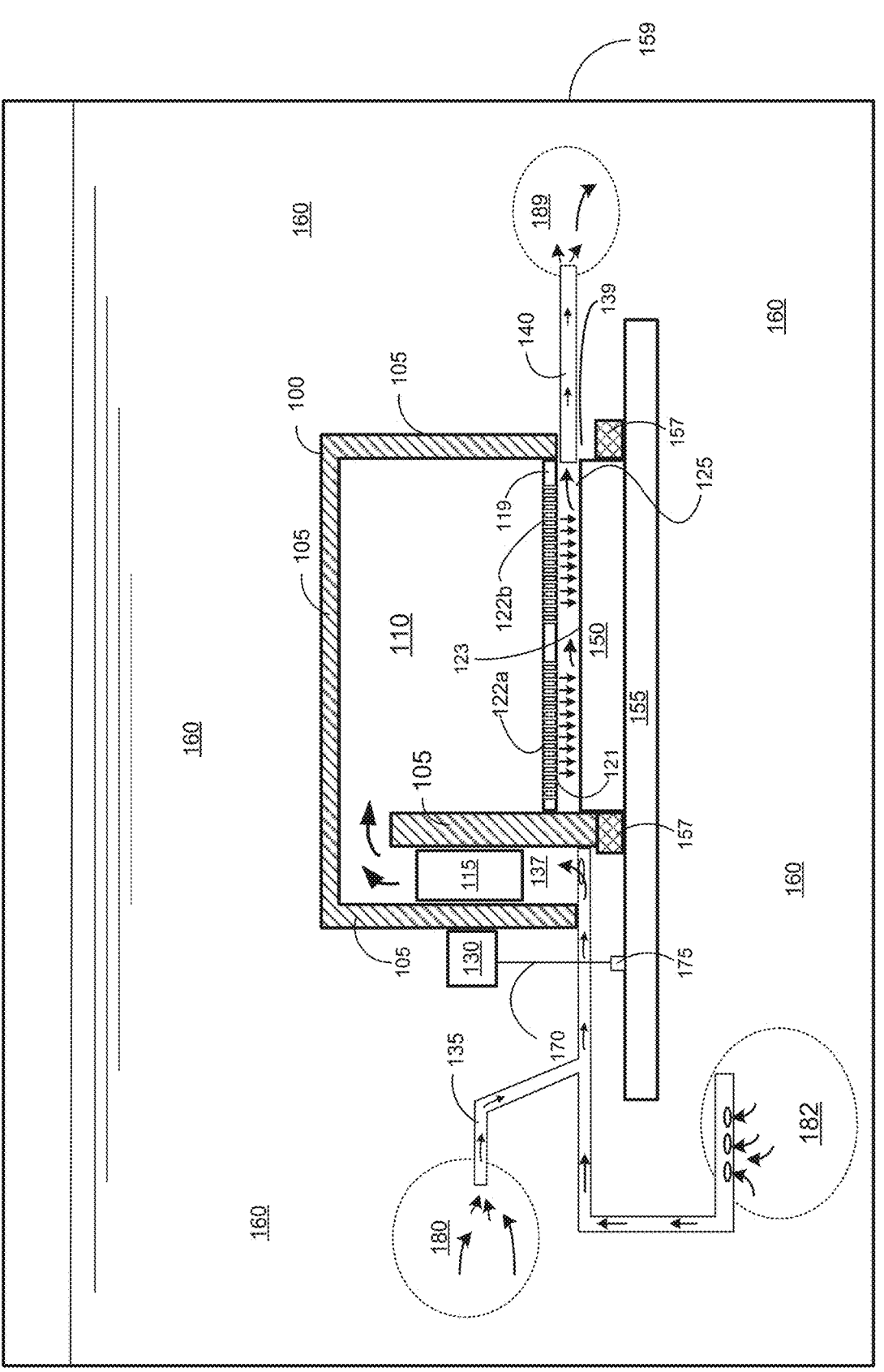
FIG. 2 shows a high-level schematic diagram illustrating by way of example a cooling module with integrated pump constructed in accordance with an embodiment of the invention, wherein the cooling module also includes fluid collection manifold and a fluid discharge manifold for targeting specific regions of the immersion cooling bath that might otherwise become stagnant, or to target the inlets and outlets of other nearby cooling modules in the immersion cooling system.

The overall heat-transfer performance and cooling capacity of an immersion cooling system may not reach its full potential if the immersion fluid 160 in some regions of the immersion bath tank 159 become relatively stagnant, leading to those regions becoming warm and/or producing hot spots in or on certain components. If electronic devices are located in these warm or hotspots, it could reduce their performance or lifespans. To address this potential problem, in some embodiments of the present invention, and as shown in FIG. 2, the cooling module 100 further comprises one or more fluid collection manifolds 135 that are fluidly coupled to the inlet 137 of the cooling module 100, and one or more discharge manifolds 140 that are fluidly coupled to the outlet 139. These fluid collection manifolds 135 and fluid discharge manifolds 140 may comprise tubing that may be configured and/or adjusted to target specific regions 180, 182 and 189 inside the immersion bath tank 159 where the immersion fluid 160 might otherwise be expected to be relatively stagnant, thereby reducing the overall heat-transfer capacity of the system. By positioning the intake ends of the fluid collection manifolds 135 and the output ends of the fluid discharge manifolds 140 at or in the immediate vicinity of these stagnant regions 180, 182 and 189, and managing the operation and throughput of the pump 115, a beneficial amount of turbulence may be produced in those regions to increase the overall flows and cooling capacity of the immersion fluid 160 in the immersion cooling tank 159.

The fluid collection manifolds 135 and the fluid discharge manifolds 140 may be constructed from rigid or flexible tubing that is preferably long enough to allow the intake and output ends of the manifolds to be positioned in the most optimal (e.g., the most stagnant) regions of the immersion bath tank 159 to ensure constant and uniform movement in the tank 159, to help eliminate or substantially reduce stagnant flow regions and hot zones, and thereby enhance the heat transfer capacity of the immersion bath system. It should be noted, however, that, while the incorporation of the fluid collection manifolds 135 and fluid discharge manifolds 140 may be preferred, they are not considered to be absolutely necessary in order to achieve some or all of the benefits of the invention. As will be discussed in more detail below in connection with FIGS. 4, 5 and 6, the fluid collection and fluid discharge manifolds 135 and 140 may also be connected to or positioned nearby other heat-generating devices attached to the same (or a different) PCB in order to draw in immersion fluid flowing around those other heat-generating electronic devices and/or discharge immersion fluid to flow into or wash over those other heat-generating devices for better overall cooling of those other devices.

FIG. 3 shows a high-level schematic diagram illustrating by way of example the components and physical layout for a typical target system where embodiments of the present invention may be beneficially applied, as viewed from a direction that is perpendicular to the processor's top plane. As shown in FIG. 3, the typical target system 300 comprises a PCB 305 with several basic data processing components attached thereto, including one or more hard drives 305, a fan connection area 310 (the fans have been removed in FIG. 3), random access memory (RAM) cards 320, two CPUs 330 and 340, several voltage regulating modules 315 for each one of the CPUs 330 and 340, and three PCIe expansion cards 350, 360 and 370. In this case, the three PCIe cards 350, 360 and 370 are all GPUs. However, it is understood that other types of PCIe cards (e.g., networking cards, GPUs, etc.) might be attached to the PCB 305 in these positions/slots. The PCB 305 and all of the attached components are submerged in an immersion fluid 380. Typically, the immersion fluid 380 flows slowly from left to right to pass over, around and through all the components attached to the PCB 305.

Figure 4:
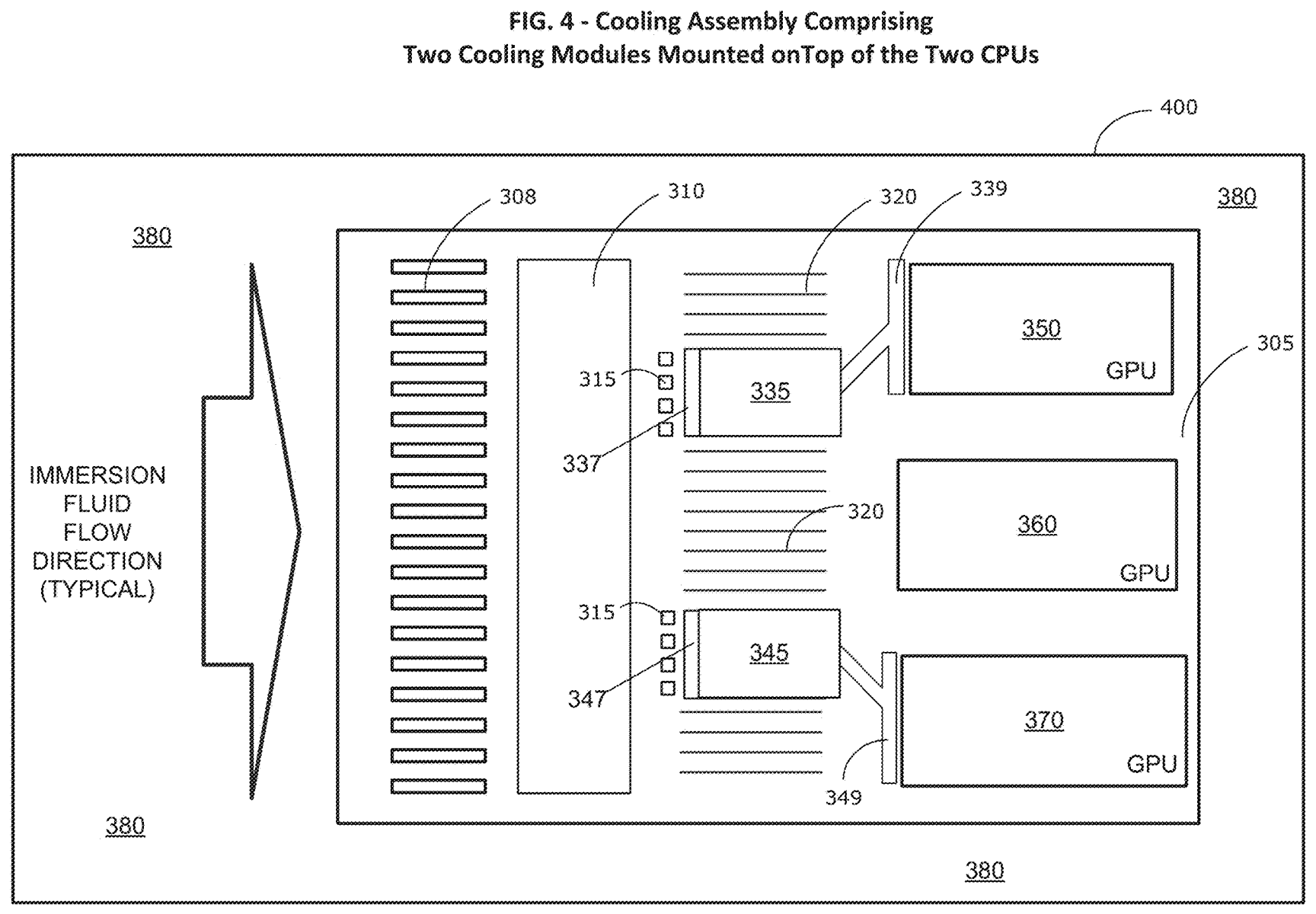

FIG. 4 shows a high-level schematic diagram illustrating by way of example an immersion cooling system 400 comprising a cooling assembly in which two cooling modules 335 and 345 constructed to operate in accordance with embodiments of the present invention have been mounted on the tops of the two CPUs 330 and 340 attached to the PCB 305 shown in FIG. 3. Although not depicted in FIG. 4, it is noted that the two cooling modules 335 and 345 mounted to the tops of the CPUs 330 and 340 each comprise a housing, a plenum and an inlet in the housing, a nozzle plate 119 with one or more microconvective nozzle arrays 122a and 122b, and an integrated pump 115 disposed between the inlet and the plenum 110 so that immersion fluid 380 entering the cooling module passes through the pump before entering the plenum 110. The integrated pump has rotors 115, and may also have gears and/or vanes that may be driven by operation of an electric motor electrically connected to a power supply connector 175 on the PCB 305, so that operation of the pump 115 rotates the rotors and/or gears to force more immersion fluid 160 into the plenum 110 and pressurizes the immersion fluid 380 in the plenum and forces some of the immersion fluid 380 in the plenum to pass through the nozzles of the microconvective nozzle array(s) in the nozzle plate to strike the top surfaces of the two CPUs 330 and 340 at a high velocity before passing out of outlets in the two cooling modules 335 and 345. This arrangement of cooling modules with integrated pumps being mounted on top of the heat-generating CPUs 330 and 340 enables better cooling of the CPUs 330 and 340 than could otherwise be achieved by the typical slow flow of immersion fluid 380 and substantially passive contact between the immersion fluid 380 and the outer surfaces of the CPUs 330 and 340.

As further illustrated by the example system in FIG. 4, two fluid collection manifolds 337 and 347 are fluidly connected to the inlets of the two cooling modules 335 and 345, respectively, and configured and positioned to draw immersion fluid 380 through the voltage regulating modules 315 for better cooling of those voltage regulating modules 315. In addition, fluid discharge manifolds 339 and 349 are attached to the outlets on the cooling modules 335 and 345 and arranged to discharge immersion fluid 380 passing out of the outlets to flow into and wash over other nearby heat-generating electronic devices attached to the PCB 305, which in this case are GPUs 350 and 370.

Figure 5:
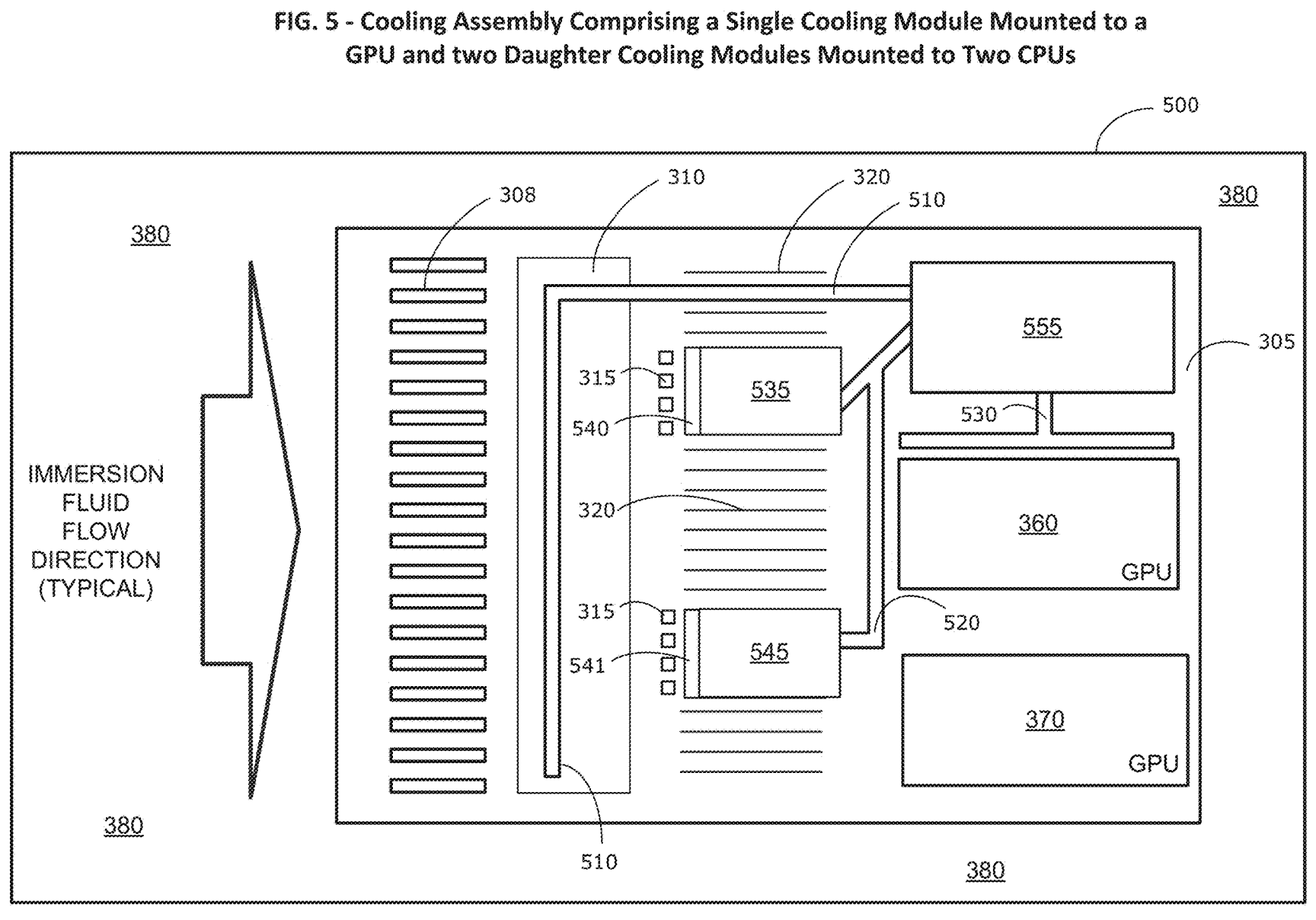

FIG. 5 shows a high-level schematic diagram illustrating by way of example an immersion cooling system 500 comprising a cooling assembly that has a single cooling module 555 mounted on top of a GPU 350 and two daughter cooling modules 535 and 545 mounted on top of the two CPUs 330 and 340, respectively. A fluid collection manifold 510 connected to the inlet of cooling module 555 and the operation of an integrated pump in cooling module 555 draws immersion fluid 380 over and through the hard drive(s) 308 for better cooling of the hard drive(s) 308 that could be achieved by immersion alone. A fluid discharge manifold 520 connected to an outlet on cooling module 555 discharges immersion fluid 380 into the inlets of a pair of daughter cooling modules 535 and 545, which are mounted to the tops of CPUs 330 and 340 so that the daughter cooling modules 535 and 545 can in turn force the immersion fluid 380 through microconvective cooling arrays inside cooling modules 535 and 545 to impinge on and cool the CPUs 330 and 340.

Implementation of daughter cards is either via a series connection (connecting the outlet or discharge manifolds of one or more cooling modules to the inlet plenum of one or more cooling modules) or a parallel connection (connecting the pressurized plenum of one or more cooling modules to the pressurized plenum of one or more daughter cooling modules). For instance, the configuration of cooling modules in FIG. 5 may be considered to constitute a series connection between the parent cooling module 555 and the daughter cooling modules 535 and 545 because the discharge manifold 520 of the parent cooling module 555 is connected to the inlets for cooling modules 535 and 545. However, the configuration of the cooling modules shown in FIG. 5 may be interpreted as constituting an example of a parallel connection between the parent cooling module 555 and the daughter cooling modules 535 and 545 if the pressurized inlet chamber of the parent cooling module 555 is connected to the pressurized inlet chamber of the daughter cooling modules 535 and 545. This second interpretation comprises a parallel connection of daughter modules.

At the same time, fluid discharge manifolds 540 and 541 connected to outlets on cooling modules 535 and 545 are configured to discharge immersion fluid 380 to wash over and into the voltage regulator modules 315 attached to the PCB 305. In this case, depending on the amount of heat that must be dissipated from the voltage regulator modules 315, it may not be necessary for the daughter cooling modules 535 and 545 to have integrated pumps to effectively cool both the CPUs beneath daughter cooling modules 535 and 545, as well as the voltage regulator modules 315 downstream from daughter cooling modules 535 and 545. Under such circumstances, one or both of the daughter cooling modules 535 and 540 may comprise a housing, an inlet connected to a plenum in the housing, and a microconvective nozzle array containing a multiplicity of nozzles configured to accelerate and direct immersion fluid 380 to strike the surfaces of CPUs 330 and 340 at a high velocity before being discharged and directed by the fluid discharge manifolds 540 and 541 to strike and wash over the voltage regulator modules 315.

Cooling modules constructed and operated in accordance with embodiments of the present invention may have multiple inputs and multiple outputs, as well as multiple fluid collection manifolds connected to their multiple inputs and multiple fluid discharge manifolds connected to their multiple outlets. Thus, as shown in FIG. 5, cooling module 555 has a second fluid discharge manifold 530 connected to a second outlet on cooling module 555. The second fluid discharge manifold 530 is arranged to direct some of the immersion fluid 380 flowing through cooling module 555 to flow into and wash over GPU 360 for better cooling of GPU 360 than would be provided by the immersion bath alone.

Figure 6:
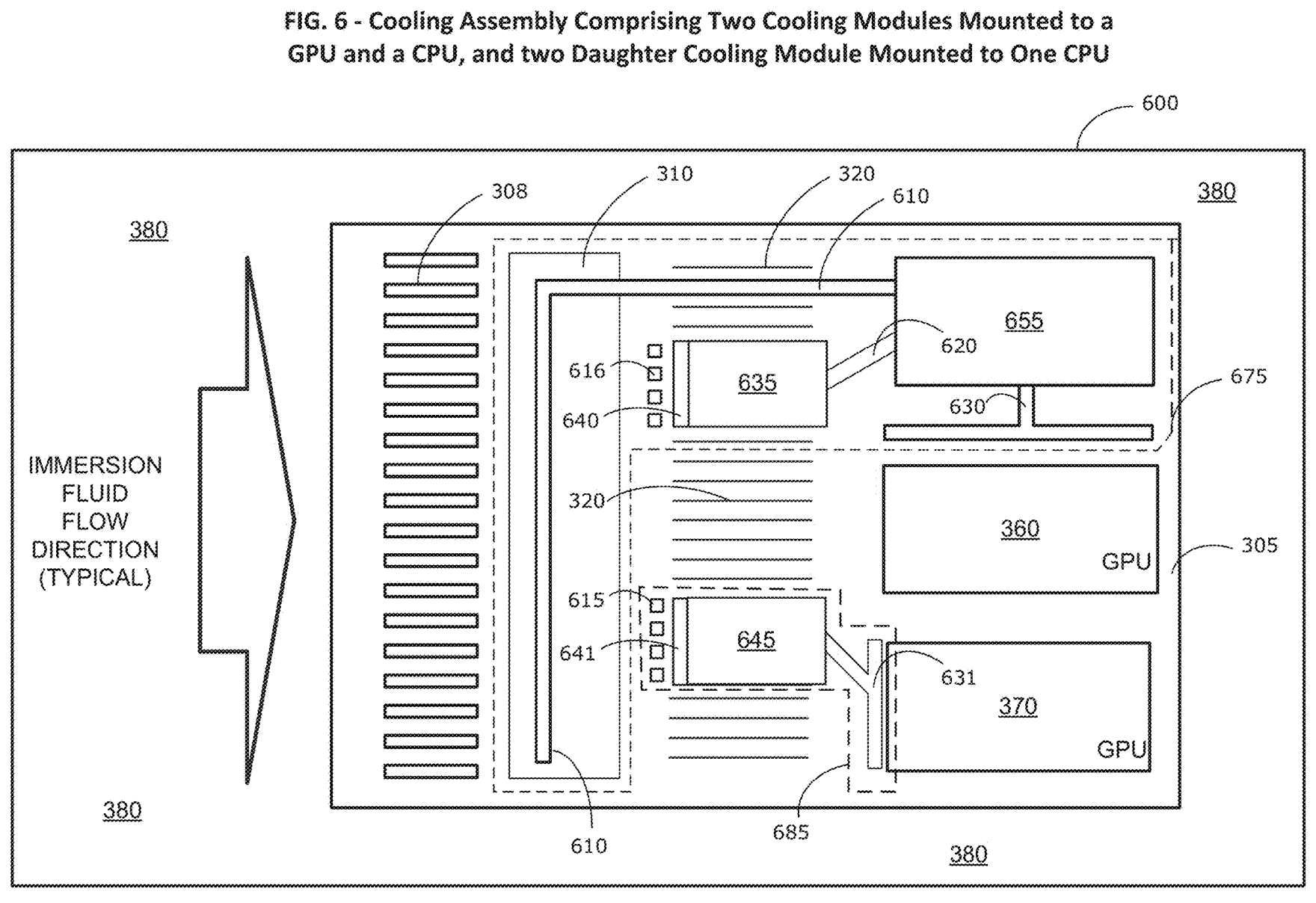

FIG. 6 shows a high-level schematic diagram illustrating by way of example an immersion cooling system 600 comprising a cooling assembly made up of two independent cooling modules 655 and 645 constructed in accordance with an embodiment of the present invention mounted on top of a GPU 350 and a CPU 340, respectively, and one daughter cooling module 635 constructed in accordance with embodiments of the present invention mounted to the top of one CPU 330 of the target system depicted in FIG. 3.

Independent cooling modules 655 and 645 both have integrated pumps, plenums and microconvective nozzle arrays designed to pressurize and accelerate immersion fluid 380 to impinge directly on and cool the surfaces of the underlying GPU 350 and CPU 340. Cooling module 655 includes a fluid collection manifold 610 connected to an inlet to draw immersion fluid 380 through hard drive(s) 308 to increase the cooling of the hard drive(s) 308, as well as a fluid discharge manifold 630 connected to an outlet, the fluid discharge manifold 630 being configured to discharge immersion fluid 380 to flow into and wash over nearby GPU 360. Independent cooling module 655 also includes a second fluid discharge manifold 620 connected to a second outlet, the second fluid discharge manifold being configured to direct immersion fluid 380 into an inlet of daughter cooling module 635. Daughter cooling module 635 includes a fluid discharge manifold 640 connected to an outlet on daughter cooling module 635, the fluid discharge manifold 640 being configured to discharge immersion fluid 380 flow into and wash over the voltage regulator modules 616. Independent cooling module 645 includes a fluid collection manifold 641 connected to an inlet to draw immersion fluid 380 through and enhance the cooling of the voltage regulator modules 615, as well as a fluid discharge manifold 631 connected to an outlet, the fluid discharge manifold 631 being configured to discharge immersion fluid 380 to flow into and wash over nearby GPU 370.

Embodiments of the present invention provide a method of cooling heat-generating electronic devices utilizing a dielectric fluid (meaning sufficiently electrically non-conductive to allow bathing of all components in the fluid). The dielectric fluid typically cools an entire electronic assembly containing both high heat flux sources and low heat flux sources. Immersion cooling typically involves the slow flow of the coolant over the components from the assembly's inlet to the assembly's outlet. The invention aids in the cooling of high heat flux sources which cannot be cooled sufficiently with the typically slow and meandering flow within the immersion cooling assembly.

Embodiments of the invention improve immersion cooling by implementing a local pumping circuit directly attached to the cooling module designed for cooling the target higher heat flux sources. Because high heat flux sources are sometimes in close proximity to each other a single pump cooling module assembly can also supply immersion fluid to nearby additional cooling modules (i.e., daughter cooling modules). Integrating the pump within the cooling module offers spatial and performance advantages because there are no conduit losses between the pump and the cooling module. Even daughter cooling modules have relatively short supply conduits and therefore remain relatively efficient in their distribution of flow energy generated by the pump.

Thus, it may be observed that FIG. 6 shows two cooling assemblies, each with its own local pumping circuit. The first cooling assembly comprises the combination of independent cooling module 655, fluid discharge manifold 620, daughter cooling module 635, fluid discharge manifold 640, fluid collection manifold 610 and fluid discharge manifold 630, which together define the local pumping circuit 675 in FIG. 6. And the second cooling assembly comprises the combination of independent cooling module 645, fluid collection manifold 641 and fluid discharge manifold 631, which define a second local pumping circuit 685 shown in FIG. 6.

The local pumping circuit is driven by an electrically powered pump with the complete circuit consisting of one or more fluid collection manifolds, the pump itself, a cooling module plenum or inlets (the inlets possibly connecting to multiple cooling modules), one or more microconvective nozzle arrays designed to direct coolant fluid to impinge on the high heat flux areas of a chip, and finally a set of fluid discharge manifolds that discharge immersion fluid to flow into and/or wash over high heat flux components located downstream of the cooling modules.

The fluid collection manifolds act as inlet conduits that can be used to assist in the optimization of the immersion oil bath by determining the locations from which fluid is drawn (e.g. an otherwise dead zone), including the proportion from each location. The fluid collection manifolds can have branches as needed to assist in optimizing the flow pattern of the immersion fluid.

The pump can take any form including positive displacement, centrifugal or axial pump. Each of these pump designs have different integration challenges and opportunities relative to the invention. Conventional positive displacement pumps require lubrication, which needs to be supplied separately. By relying on the immersion fluid to provide the necessary lubrication and allowing some leakage, it is possible to reduce the driving torque for the positive displacement pumps and reduce the size of the motor required to run the positive displacement pump. Centrifugal and axial pumps can be implemented at higher efficiency due to a reduction in seal losses because the drive units of centrifugal pumps need not be kept isolated from the fluid being pumped.

Implementing a direct connection between the fluid discharge manifolds (series connection) or pressurized inlet plenum (parallel connection) and the downstream (daughter) cooling modules achieves several benefits, simplifying the mechanical connection to the cooling module since limited leakage is acceptable, and reducing the size of the pressure drops between the discharge end of the pump and cooling module and the associated microconvective nozzle array. Moreover, the microconvective nozzle array performance is enhanced by the close coupling of pump and cooling module by being able to expend a greater fraction of the pump-generated fluid power compared to a set-up with pump and cooling module separated.

The discharge flow can be used to provide further optimization of cooling within the immersion cooled assembly by 1) directing the discharge from the cooling module in such a way so as to entrain additional fresh immersion fluid and having this flow provide cooling to targeted areas; 2) implementing the collection and direction of discharge flow at multiple locations; and 3) capturing the discharge flow in one or more conduits to implement the benefits of entrainment, mixing and targeted cooling away from the immediate vicinity of the cooling module. By careful design of the inlets and outlets, re-entrainment can be avoided, thereby optimizing the cooling performance for the targeted high heat flux sources.

All of the nozzles in the microconvective nozzle array of the nozzle plate need not have the same design or geometry. There could be any number of different nozzle types within an array of microjets. This includes, but is not limited to, some nozzles having features to alter the fluid flow (with regard to uniformity, direction, velocity, etc.), some nozzles having features to increase area, some nozzles having both, and some nozzles having no enhancing features designed to alter the fluid flow.

Figure 7A:
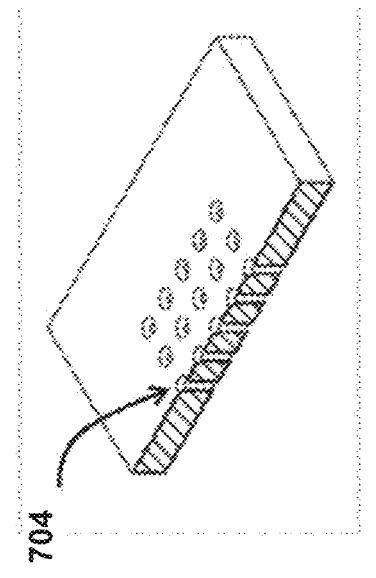
FIGS. 7A and 7B show an embodiment of a nozzle plate comprising a microconvective nozzle array that may be used in embodiments of the present invention, where
Figure 7B:
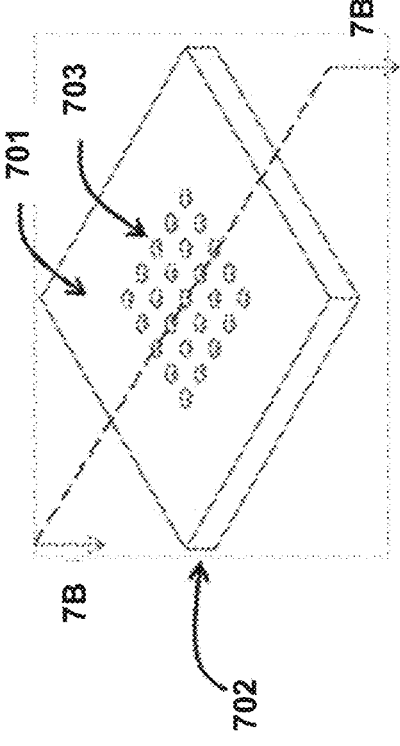

FIG. 7A shows an embodiment of a nozzle plate 701 comprising a microconvective nozzle array 703 that may be used in embodiments of the present invention. FIG. 7B is a cross-sectional view of the nozzle plate 701 shown in FIG. 7A when the nozzle plate 701 is sectioned along the line 7B-7B of FIG. 7A. As shown in FIGS. 7A and 7B, the nozzle plate 701 of thickness 702 has an array of microjet nozzles 703. The nozzles in the array of microjet nozzles 703 may have a variety of different geometries, including without limitation, straight, converging or chamfered cylinders. By taking a cross section of the nozzle plate 701, as shown in FIG. 7B, the shape of the nozzles can be better observed. In this particular example, the inlet side of the nozzles in the array 703 includes a chamfered edge 704. The larger diameter taper created by the chamfered edge 704 enhances microjet nozzle cooling by increasing the nozzle efficiency providing greater velocity at a given differential pressure between the plenum and the impingement channel. Note that the geometric features of the chamfer such as angle, depth, and diameter may be selected and configured to produce an optimal desired impingement and heat transfer result without departing from the scope of claimed invention. Similarly, nozzle size and angle may be manipulated for the array as a whole, or manipulated on a nozzle-by nozzle basis to optimize pressure drop and maximize the heat transfer on the target component's heat rejection surface.

Figures 8A, 8B, 8C:
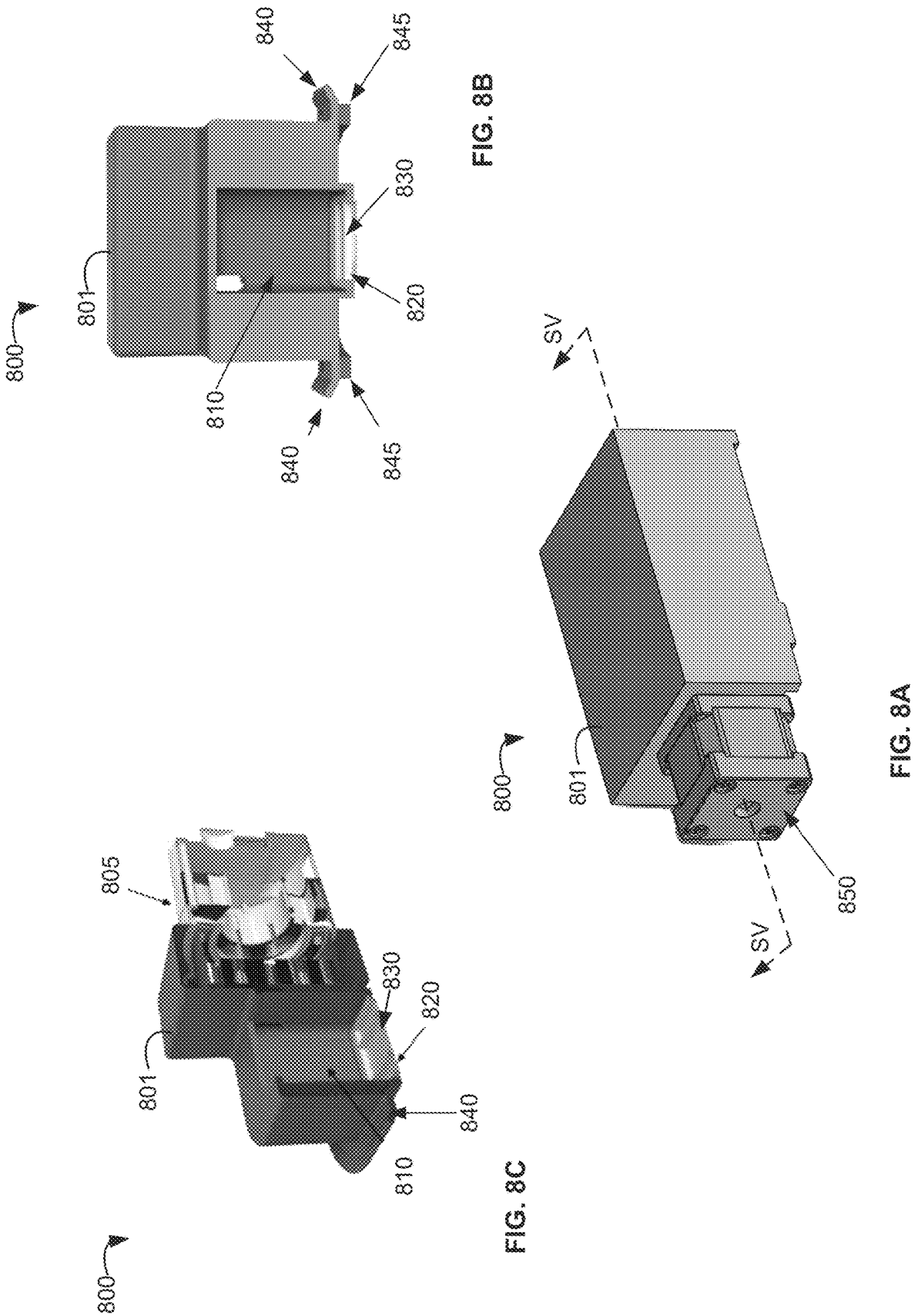
FIGS. 8A, 8B and 8C show, by way of example, a sectioned perspective view, a sectioned rear view, and an isometric view, respectively, of a cooling module 800 with a side-mounted integrated pump constructed in accordance with embodiments of the present invention.

FIGS. 8A, 8B and 8C show, by way of example, a sectioned perspective view, a sectioned rear view, and an isometric view, respectively, of a cooling module 800 with a side-mounted integrated pump constructed in accordance with embodiments of the present invention.

As shown in FIGS. 8A, 8B and 8C, the cooling module 800 comprises a housing 801, an integrated pump 805, a plenum 810 and a nozzle plate 820 comprising a microconvective nozzle array 830. The cooling module 800 may also include a side-mounted motor 850 to drive the pump 805.

In preferred embodiments, the cooling module 800 further comprises one or more server attachment flanges 840 to assist in fastening the cooling module 800 to a PCB (not shown). The cooling module may also include effluent routing vanes 845 to help guide immersion fluid flows to outlets and to ensure uniform discharge of immersion fluid. The effluent routing vanes 845 also may be configured to help direct immersion fluid exiting the cooling module 800 to flow into fluid discharge manifolds connected to other (i.e., daughter) cooling modules or to flow over nearby electronic components that may be connected to the same PCB or nearby PCBs.

Typically, the plenum 810 comprises a rectangular-shaped chamber with one or more inlets or channels that are in fluid communication with the integrated pump 805. In some embodiments, the cooling module may have multiple plenums (such as an "inlet plenum" and an "outlet plenum") and multiple pumps. Baffles and/or valves may be installed inside the cooling module, or positioned adjacent to or nearby the cooling module 800 to help ensure that fluid flowing into and out of the cooling module 800 remain calm and uniform.

Figure 9B:
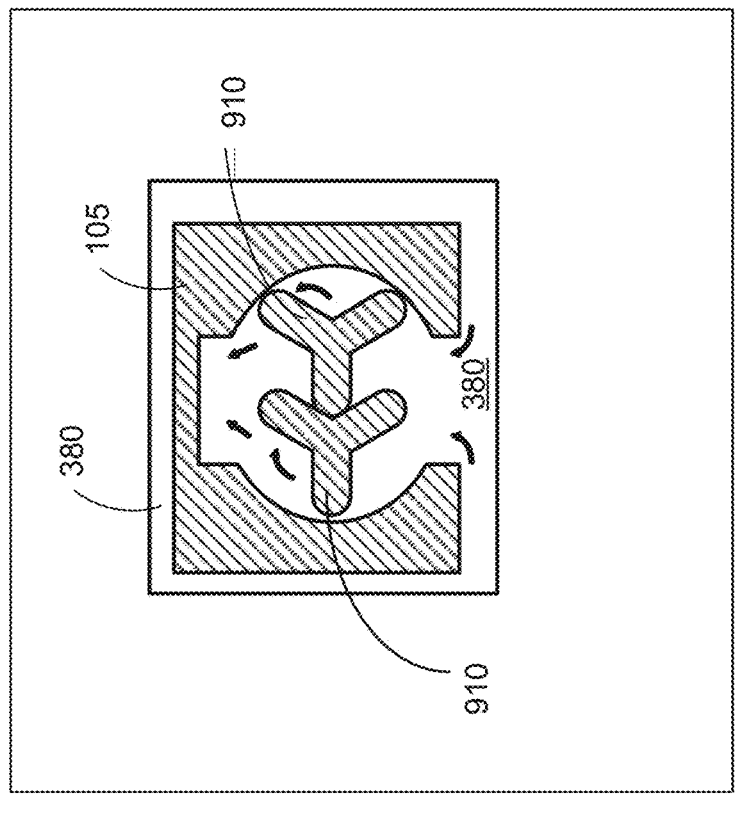
FIGS. 9A and 9B show front and side sectional views, respectively, of a cooling module constructed in accordance with one embodiment of the present invention, wherein the integrated pump is a side-mounted, tri-lobe-styled positive displacement pump.
Figure 9A:
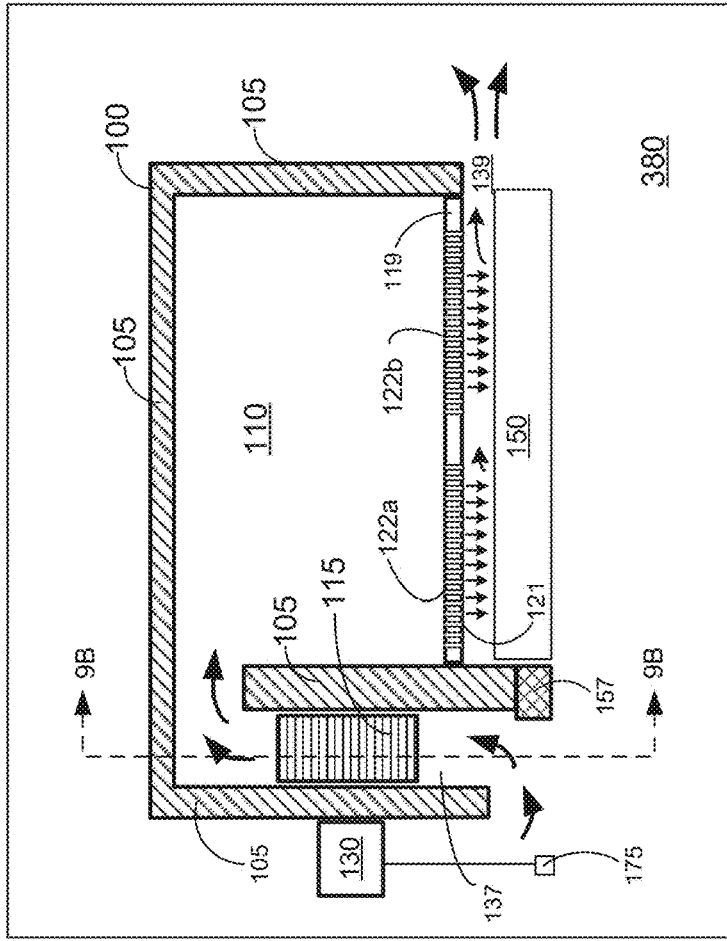

FIGS. 9A and 9B show front and side sectional views, respectively, of a cooling module constructed in accordance with one embodiment of the present invention, wherein the integrated pump is a side-mounted tri-lobe styled positive displacement pump. FIG. 9A shows a front sectional view of the cooling module, sectioned along the line SV-SV of FIG. 8A. FIG. 9B shows a side sectional view of the cooling module, sectioned along the line 9B-9B of FIG. 9A. As shown in FIG. 9A, the cooling module 100 is mounted on a fastening base 157, which is affixed to a PCB (not shown in FIG. 9). The cooling module 100, along with the PCB, the heat-generating electronic device 150 attached to the PCB, are completely submerged in an immersion fluid 380. As described above in connection with FIG. 1, the housing 105, the plenum 110, the pump 115 and the motor 130 are arranged and configured so that, during operation, of the motor and the pump 115, the pump rotors 910 rotate in synchronized fashion to draw immersion fluid 380 into the inlet 137 of the cooling module 100. The action of the rotors 910 of the pump 115 forces more immersion fluid 380 into the plenum 110 on each revolution of the rotors, thereby pressurizing the immersion fluid 380 in the plenum 110 and forcing some of the immersion fluid 380 to pass into and through the microconvective nozzle arrays 122a and 122b in the nozzle plate 119. The nozzles in the microconvective nozzle arrays 122a and 122b accelerate the immersion fluid and cause it to directly impinge on the surface of the heat-generating electronic device 150 at a high velocity to absorb heat from the surface prior to being carried out of the cooling module 100 via the outlet 139 and back into the immersion cooling tank.

Figure 10B:
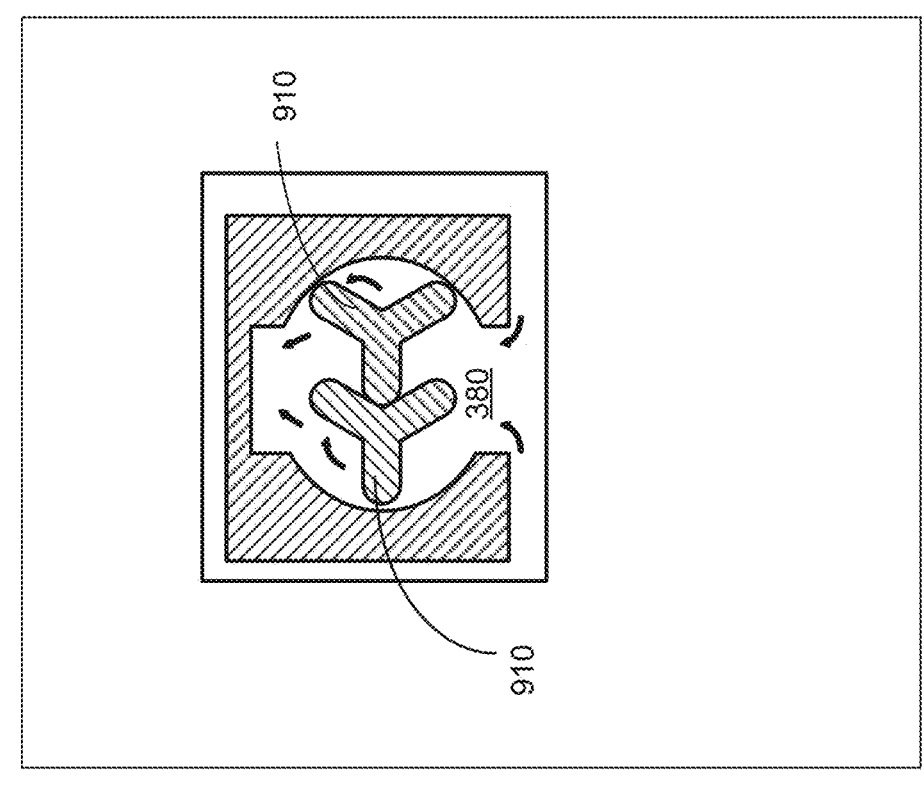
FIGS. 10A and 10B show front and top sectional views, respectively, of a cooling module constructed in accordance with another embodiment of the present invention, wherein the integrated pump is a top-mounted, tri-lobe styled positive displacement pump.
Figure 10A:
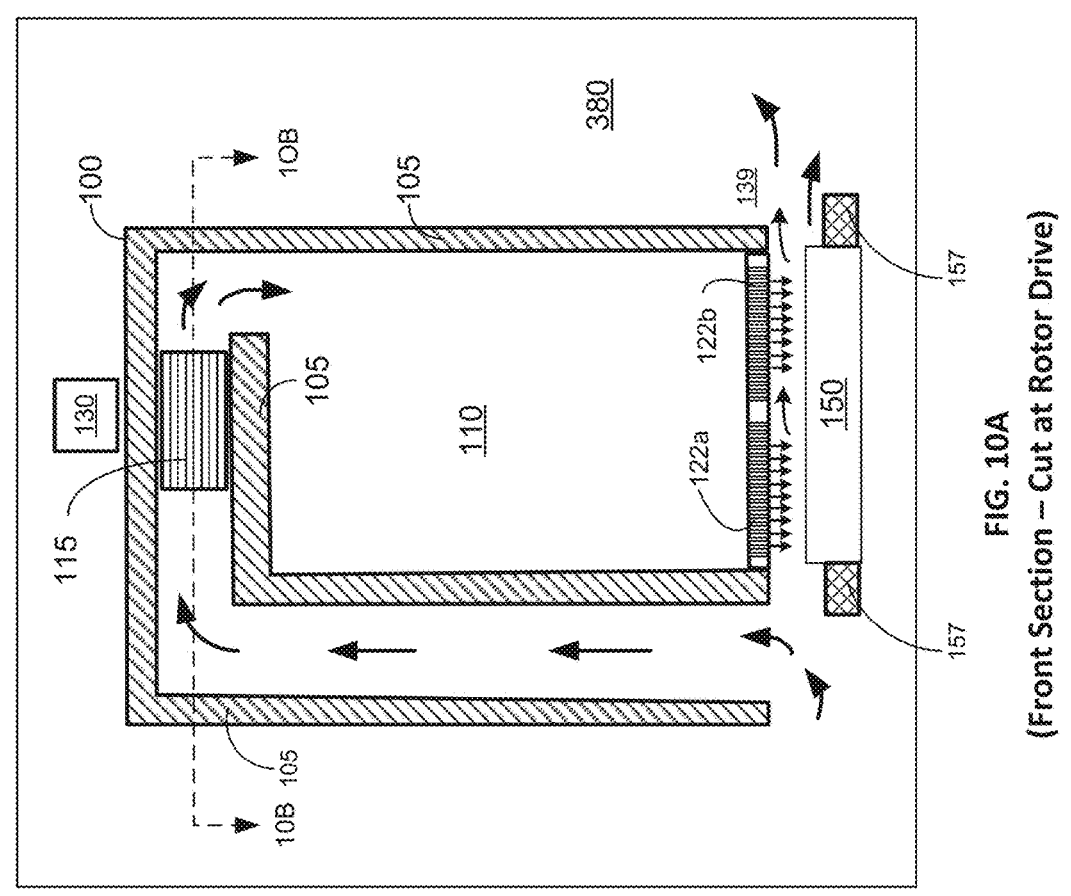

FIGS. 10A and 10B show front and top sectional views, respectively, of a cooling module constructed in accordance with another embodiment of the present invention, wherein the integrated pump is a top-mounted tri-lobe styled positive displacement pump. FIG. 10A shows a front sectional view of the cooling module, sectioned along the center of the rotor drive, and FIG. 10B shows a top sectional view of the cooling module, sectioned along the line 10B-10B of FIG. 10A. This embodiment operates in substantially the same fashion as the embodiment shown in FIGS. 9A and 9B, except that the integrated pump 115 and pump rotors 910 are on top of the housing, opposite from the nozzle plate 119 and the microconvective nozzle arrays 122a and 122b.

Figures 11A, 11B:
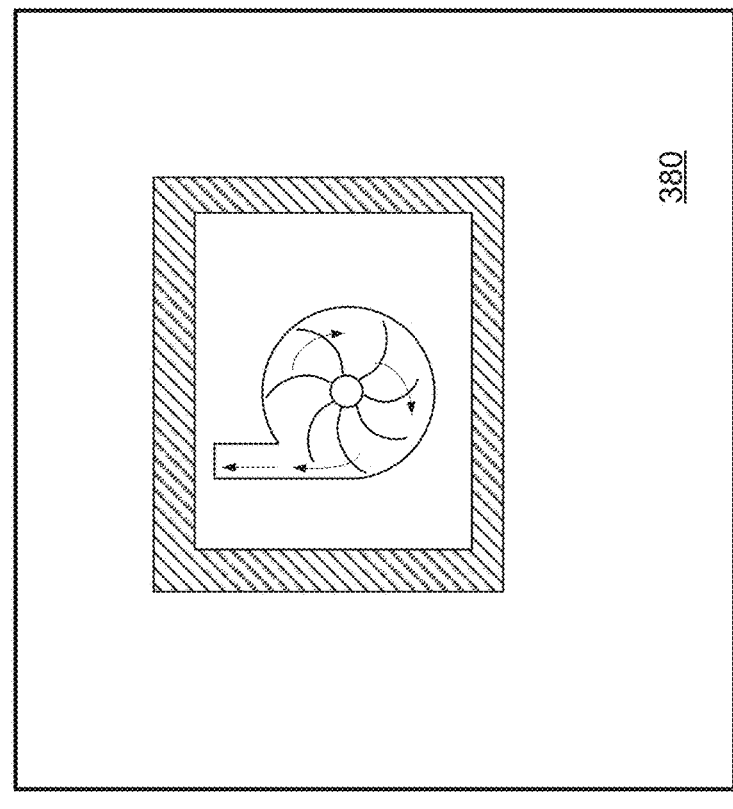
FIGS. 11A and 11B show front and side sectional views, respectively, of a cooling module constructed in accordance with one embodiment of the present invention, wherein the integrated pump is a side-mounted, centrifugal pump.

FIGS. 11A and 11B show front and side sectional views, respectively, of a cooling module constructed in accordance with one embodiment of the present invention, wherein the integrated pump is a side-mounted centrifugal pump. FIG. 11A shows a front sectional view of the cooling module, sectioned along the line SV-SV of FIG. 8A, and, FIG. 11B shows a side sectional view of the cooling module, sectioned along the line 11B-11B of FIG. 11A.

Figure 12B:
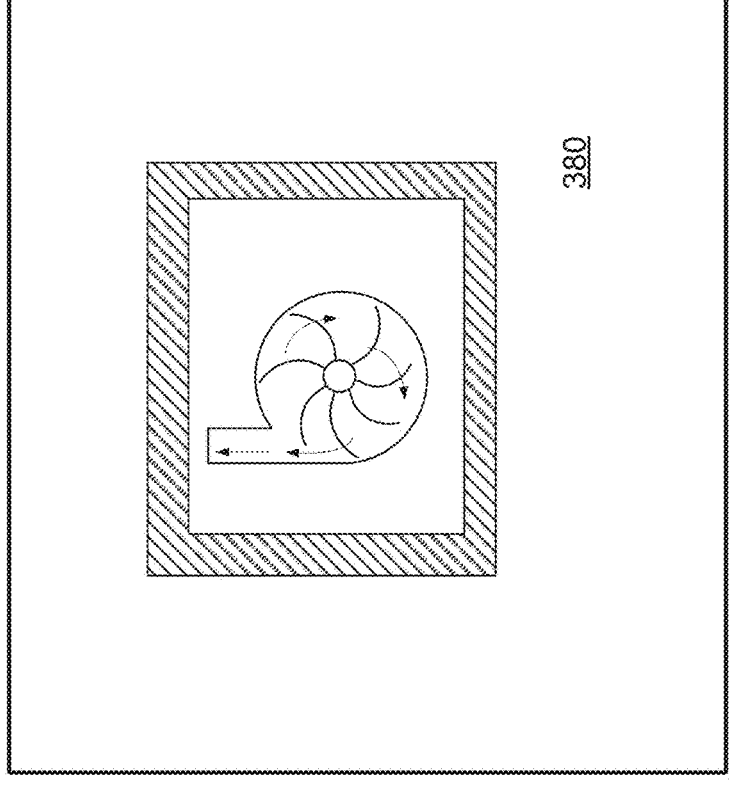
FIGS. 12A and 12B show front and top sectional views, respectively, of a cooling module constructed in accordance with yet another embodiment of the present invention, wherein the integrated pump is a top-mounted centrifugal pump.
Figure 12A:
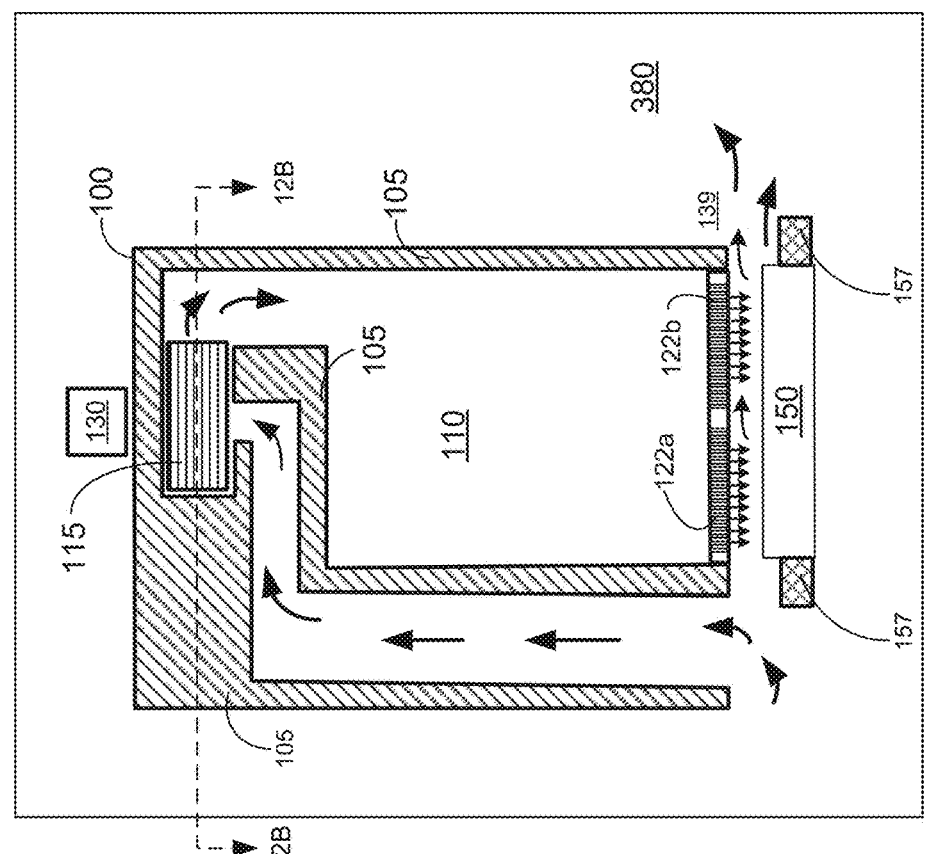

FIGS. 12A and 12B show front and top sectional views, respectively, of a cooling module constructed in accordance with one embodiment of the present invention, wherein the integrated pump is a top-mounted centrifugal pump. FIG. 12A shows a front sectional view of the cooling module, sectioned along the line SV-SV of FIG. 8A. FIG. 12B shows a side sectional view of the cooling module, sectioned along the line 12B-12B of FIG. 12A.

Figure 13B:
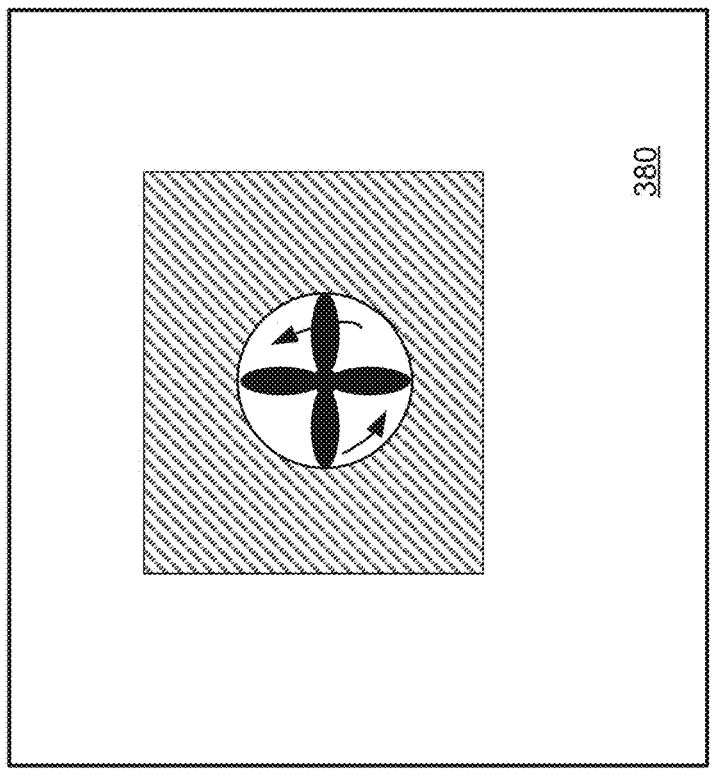
FIGS. 13A and 13B show front and side sectional views, respectively, of a cooling module constructed in accordance with one embodiment of the present invention, wherein the integrated pump is a side-mounted axial pump.
Figure 13A:
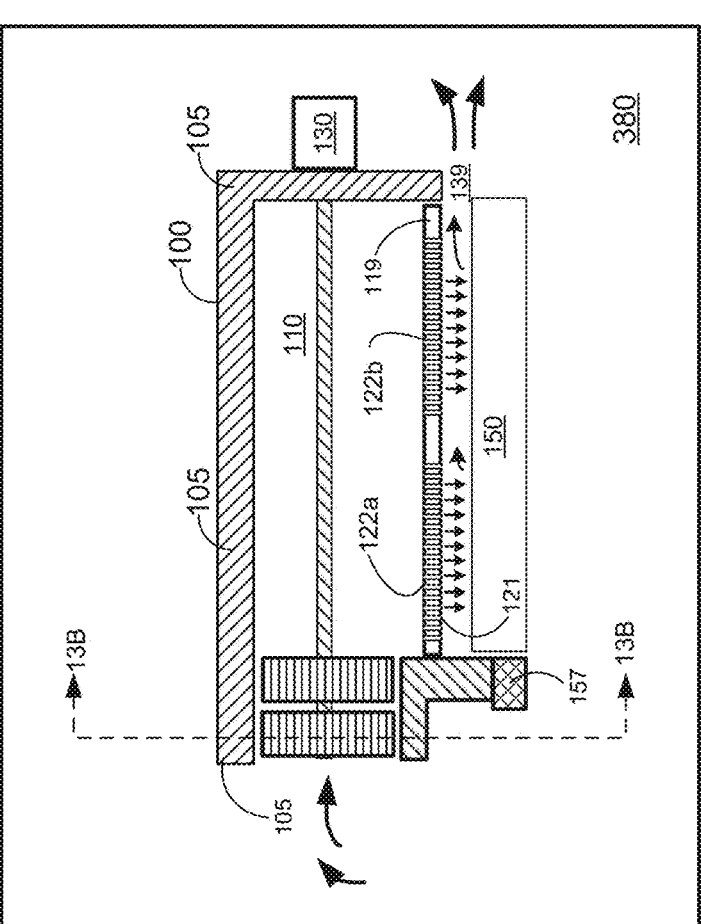

FIGS. 13A and 13B show front and side sectional views, respectively, of a cooling module constructed in accordance with one embodiment of the present invention, wherein the integrated pump is a side-mounted axial pump. FIG. 13A shows a front sectional view of the cooling module, sectioned along the line SV-SV of FIG. 8A. FIG. 13B shows a side sectional view of the cooling module, sectioned along the line 13B-13B of FIG. 13A.

The above-described preferred embodiments are intended to illustrate the principles of the invention, but not to limit its scope. Various other embodiments, modifications and equivalents to these preferred embodiments may occur to those skilled in the art upon reading the present disclosure or practicing the claimed invention. Such variations, modifications and equivalents are intended to come within the scope of the invention and the appended claims.

What is claimed is:

1. A cooling module for cooling a heat-generating electronic device attached to a printed circuit board immersed in a container of immersion fluid, the cooling module comprising: (a) a housing comprising set of inner walls; (b) a nozzle plate, fixedly attached to the housing, the nozzle plate comprising a fluid receiving side, a fluid ejection side, opposite the fluid receiving side, and a multiplicity of nozzles extending through the nozzle plate from the fluid receiving side to the fluid ejection side, each nozzle adapted to produce a microjet of immersion fluid as the immersion fluid exits the fluid ejection side of the nozzle plate; (c) a fastener for attaching the cooling module to the heat-generating electronic device, opposite the printed circuit board, so that the fluid ejection surface of the nozzle plate is oriented to face an impingement zone on the heat-generating electronic device, the fluid ejection surface of the nozzle plate being spaced apart from the impingement zone so as to define an impingement channel and an outlet between the cooling module and the heat-generating electronic device; (d) a plenum defined by the inner walls of the housing and the nozzle plate; (e) an inlet formed in the housing and in fluid communication with the plenum, the inlet configured to permit immersion fluid in the container to pass into the housing; and (f) a pump comprising a motor mechanically connected to a set of rotors disposed inside the housing; (g) whereby (i) operation of the motor rotates the set of rotors on the pump, causing the set of rotors to fill and pressurize the plenum by drawing immersion fluid from the container into the housing through the inlet and pushing the immersion fluid into the plenum, and (ii) pressurizing the plenum causes the multiplicity of nozzles in the nozzle plate to eject a multiplicity of microjets into the impingement channel to strike the impingement zone of the heat-generating electronic device before exiting the cooling module through the outlet; further comprising a fluid collection manifold, fluidly coupled to the inlet of the cooling module; and wherein the fluid collection manifold is configured to draw immersion fluid from a stagnant region of immersion fluid in the container.

2. The cooling module of claim 1, wherein the pump is a positive displacement pump.

3. The cooling module of claim 1, wherein the pump is a centrifugal pump.

4. The cooling module of claim 1, wherein the pump is an axial pump.

5. The cooling module of claim 1, wherein the heat-generating electronic device attached to the printed circuit board comprises:
  (a) a central processing unit; or
  (b) a graphical processing unit; or
  (c) a component of a power inversion system; or
  (d) a component of a power conversion system; or
  (e) a combination of two or more of the above-listed devices.

6. The cooling module of claim 1, wherein the nozzle plate comprises one or more microconvective nozzle arrays.

7. The cooling module of claim 1, wherein the fluid collection manifold is configured to draw immersion fluid from the outlet of another cooling module constructed according to claim 1.

8. The cooling module of claim 1, wherein the fluid collection manifold is configured to draw immersion fluid from a vicinity of: (a) a central processing unit; or (b) a graphical processing unit; or (c) a component of a power inversion system; or (d) a component of a power conversion system; or (e) a hard disk drive; or (f) a voltage regulator module; or (g) an electronic memory device; or (h) a combination of two or more of the above-listed devices.

9. The cooling module of claim 1, wherein the fluid collection manifold is configured to draw immersion fluid from an external heat exchanger.

10. The cooling module of claim 1, wherein the cooling module further comprises: (a) a second inlet; and (b) a second fluid collection manifold fluidly coupled to the second inlet.

11. The cooling module of claim 1, further comprising a fluid discharge manifold, fluidly coupled to the outlet of the cooling module.

12. The cooling module of claim 11, wherein the fluid discharge manifold is configured to discharge immersion fluid into a stagnant region of immersion fluid in the container.

13. The cooling module of claim 11, wherein the fluid discharge manifold is configured to discharge immersion fluid so that the immersion fluid will flow into or wash over another heat-generating electronic device attached to the printed circuit board.

14. The cooling module of claim 11, wherein the fluid discharge manifold is configured to discharge immersion fluid into the inlet of another cooling module constructed according to claim 1.

15. The cooling module of claim 11, wherein the fluid discharge manifold is configured to discharge immersion fluid into a vicinity of:
  (a) a central processing unit; or
  (b) a graphical processing unit; or
  (c) a component of a power inversion system; or
  (d) a component of a power conversion system; or
  (e) a hard disk drive; or
  (f) a voltage regulator module; or
  (g) an electronic memory device; or
  (h) a combination of two or more of the above-listed devices.

16. The cooling module of claim 11, wherein the fluid discharge manifold is configured to discharge immersion fluid into an external heat exchanger.

17. The cooling module of claim 11, further comprising:
  (a) a second outlet; and
  (b) a second fluid discharge manifold connected to the second outlet.

18. The cooling module of claim 1, further comprising:

(a) a second inlet;

(b) a second pump comprising a second motor mechanically connected to a second set of rotors disposed inside the housing; and (c) operation of the second motor rotates the second set of rotors on the second pump, causing the second set of rotors to fill and pressurize the plenum by drawing immersion fluid from the container into the housing through the second inlet and pushing the immersion fluid into the plenum.

19. The cooling module of claim 1, further comprising a fluid reservoir interposed between the set of rotors and the plenum such that the immersion fluid drawn into the housing by the set of rotors passes through the reservoir before passing into and pressurizing the plenum.

20. The cooling module of claim 1, further comprising an electrical power cable that electrically couples the motor to an electrical power supply port on the printed circuit board and supplies electrical power for operation of the motor.

21. The cooling module of claim 1, wherein the fastener comprises a server attachment flange configured to assist in mounting the cooling module to the heat-generating electronic device.

22. The cooling module of claim 1, wherein the fastener comprises a torsion screw configured to assist in mounting the cooling module to the heat-generating electronic device.

23. The cooling module of claim 1, further comprising an effluent routing vane to guide immersion fluid flowing out of the outlet.

\* \* \* \* \*